United States Patent
Liu et al.

(10) Patent No.: US 8,508,025 B2
(45) Date of Patent: Aug. 13, 2013

(54) FOLDED LEADFRAME MULTIPLE DIE PACKAGE

(75) Inventors: Yong Liu, Scarborough, ME (US); Tiburcio A. Maldo, Suzhou (CN); Hua Yang, Suzhou (CN)

(73) Assignee: Fairchild Semiconductor Corporation, South Portland, ME (US)

( * ) Notice: Subject to any disclaimer, the term of this patent is extended or adjusted under 35 U.S.C. 154(b) by 0 days.

(21) Appl. No.: 13/492,074

(22) Filed: Jun. 8, 2012

(65) Prior Publication Data

US 2012/0241930 A1 Sep. 27, 2012

Related U.S. Application Data

(62) Division of application No. 12/025,798, filed on Feb. 5, 2008, now Pat. No. 8,198,710.

(51) Int. Cl.
*H01L 23/495* (2006.01)

(52) U.S. Cl.
USPC .......................................... 257/675

(58) Field of Classification Search
USPC ................ 257/666, 672, 675, 676, 678, 692, 257/696, 735, 736, 748, 750, 686, 688, 707, 257/777–784, E25.006, E25.013, E25.018, 257/E25.021, E25.027, E23.085, E21.614, 257/E23.05; 438/111, 112, 109, 123, FOR. 368, 438/FOR. 426
See application file for complete search history.

(56) References Cited

U.S. PATENT DOCUMENTS

| | | | |
|---|---|---|---|
| 3,597,666 A * | 8/1971 | Taskovich | 257/674 |
| 5,049,973 A | 9/1991 | Satriano et al. | |
| 5,614,441 A | 3/1997 | Hosokawa et al. | |
| 6,590,282 B1 * | 7/2003 | Wang et al. | 257/686 |
| 2005/0184372 A1 | 8/2005 | Asahi et al. | |
| 2005/0186710 A1 | 8/2005 | Moyer et al. | |
| 2006/0044749 A1 | 3/2006 | Pauley et al. | |
| 2007/0096278 A1 * | 5/2007 | Nakatsu et al. | 257/678 |

* cited by examiner

*Primary Examiner* — Marcos D. Pizarro
*Assistant Examiner* — Suian Tang
(74) *Attorney, Agent, or Firm* — Christensen O'Connor Johnson Kindness PLLC

(57) ABSTRACT

A multiple die package includes a folded leadframe for interconnecting at least two die attached to another leadframe. In a synchronous voltage regulator the folded leadframe, which is formed from a single piece of material, connects the high side switching device with the low side switching device to provide a low resistance, low inductance connection between the two devices.

17 Claims, 30 Drawing Sheets

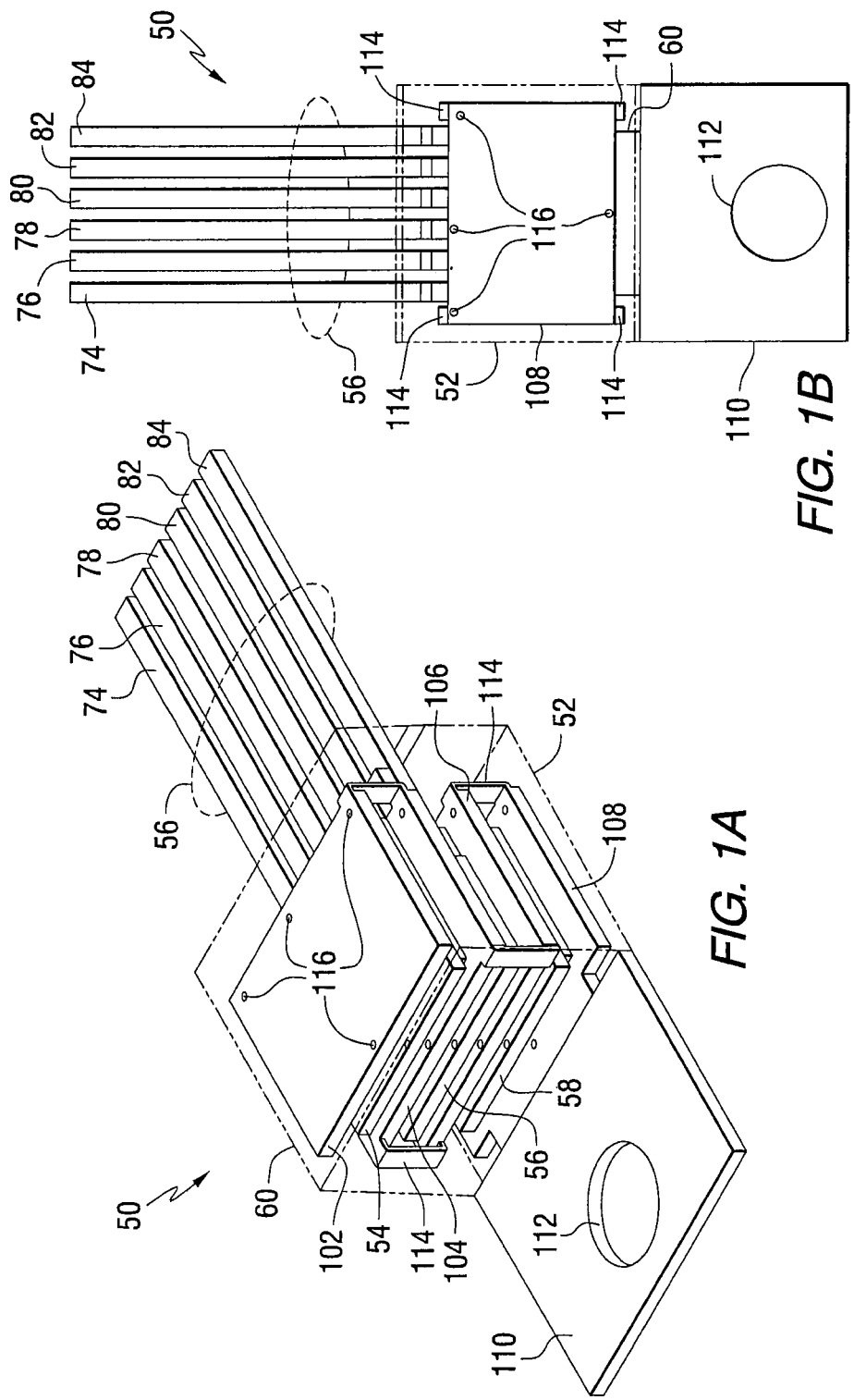

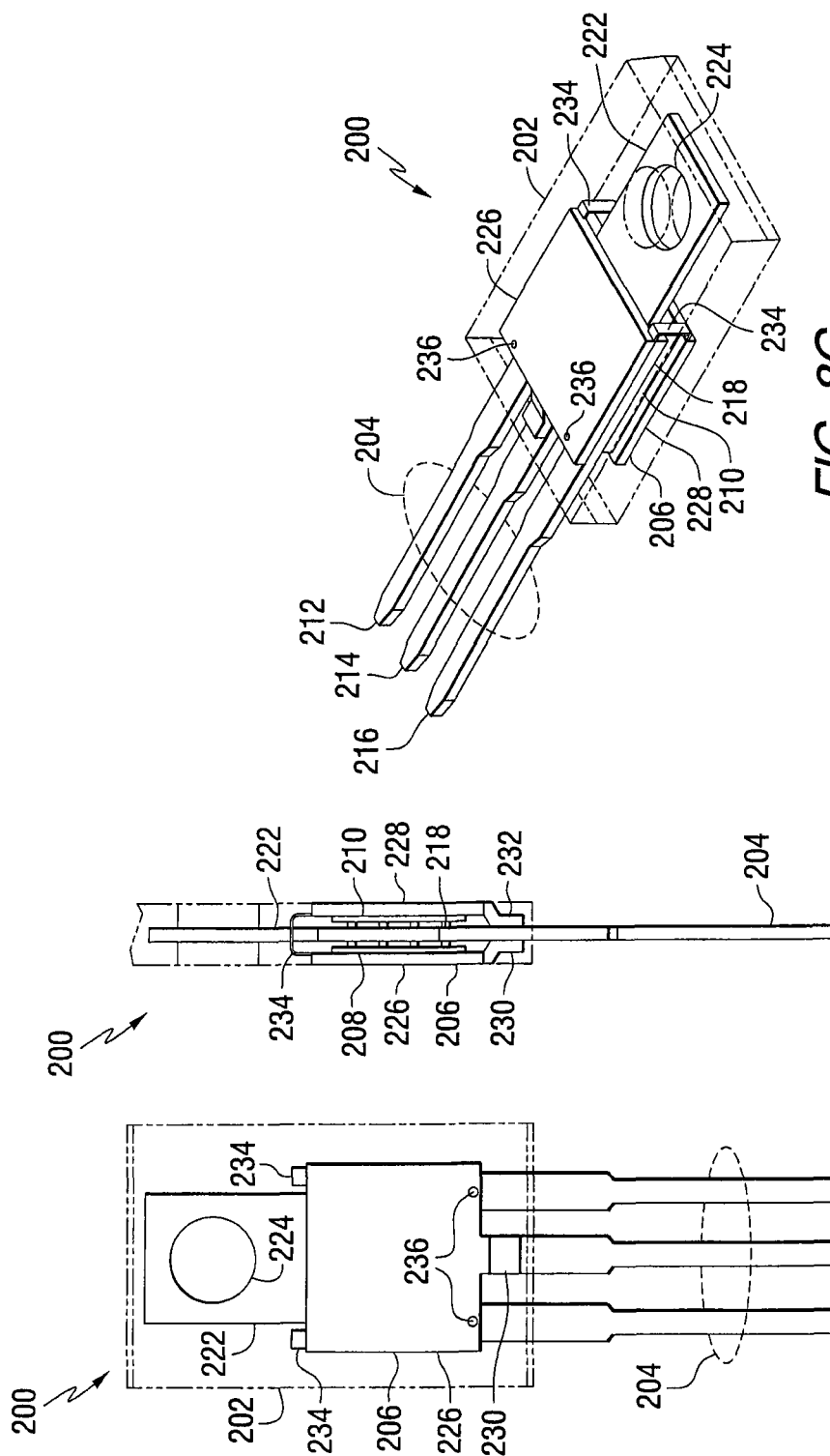

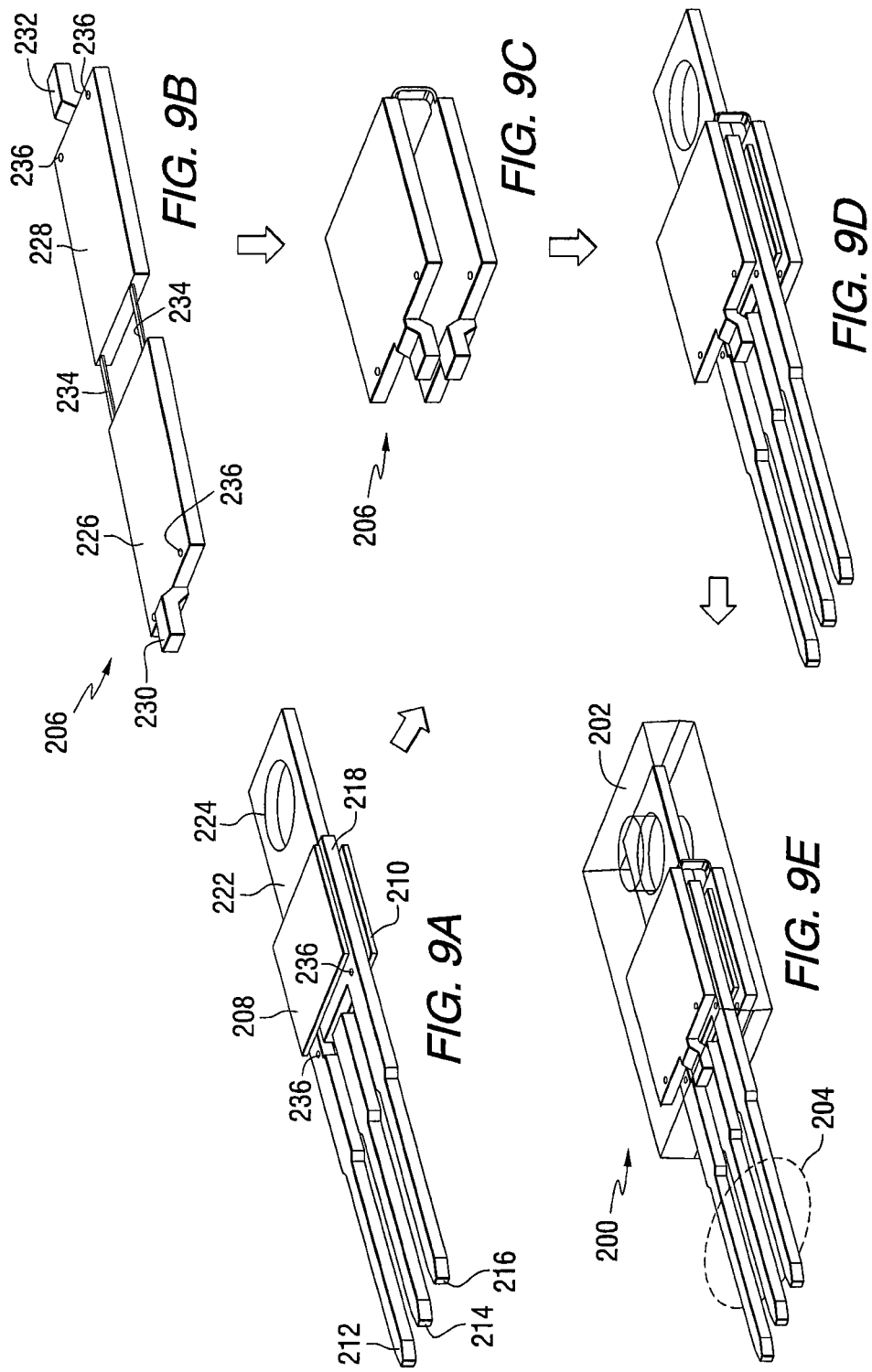

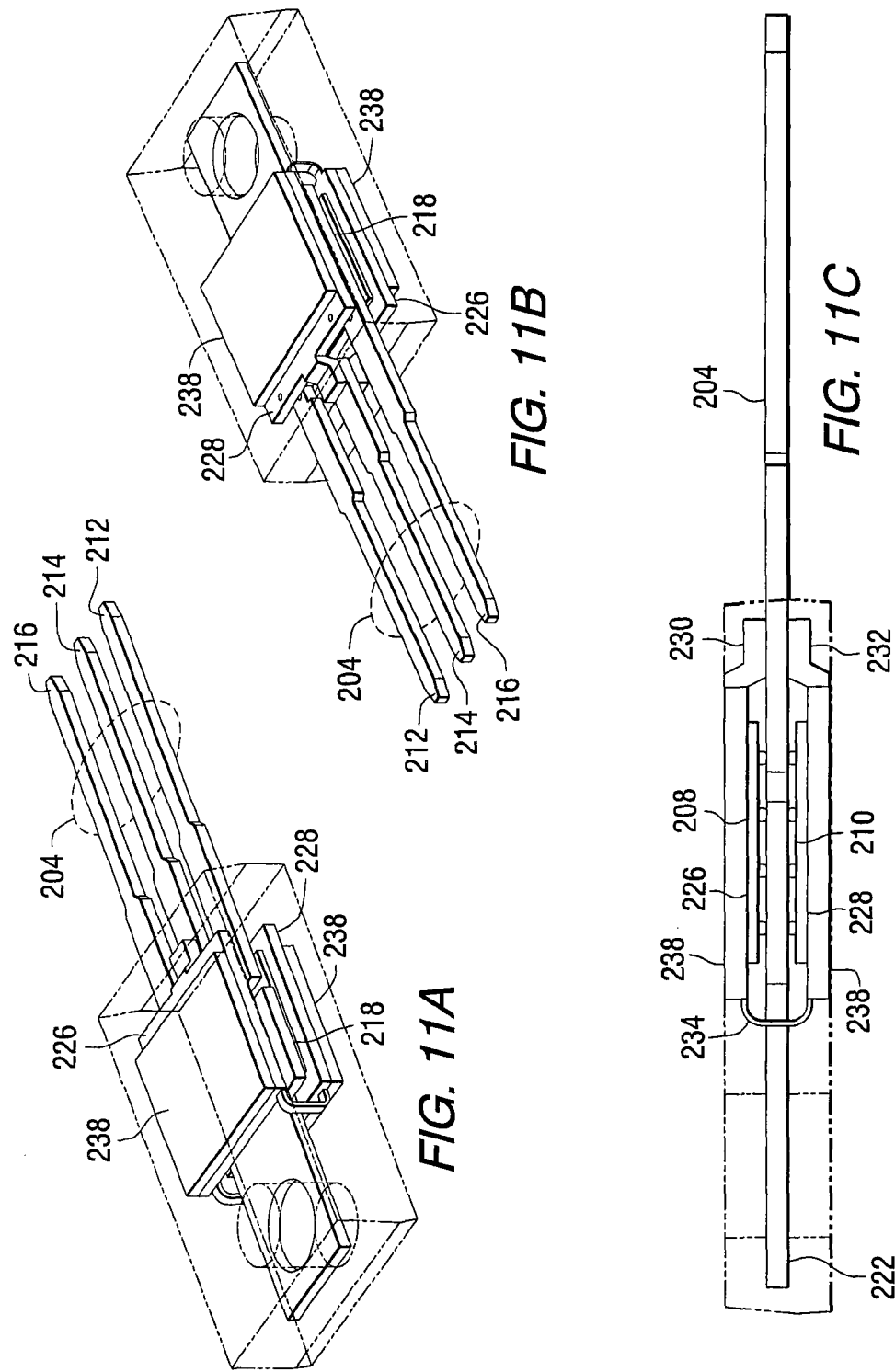

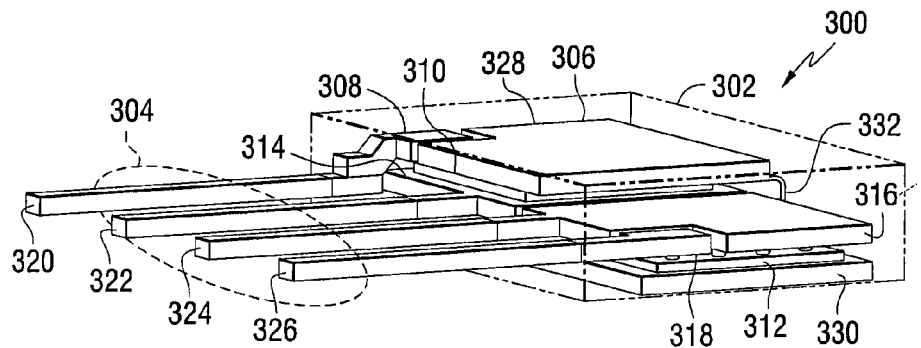
FIG. 12A
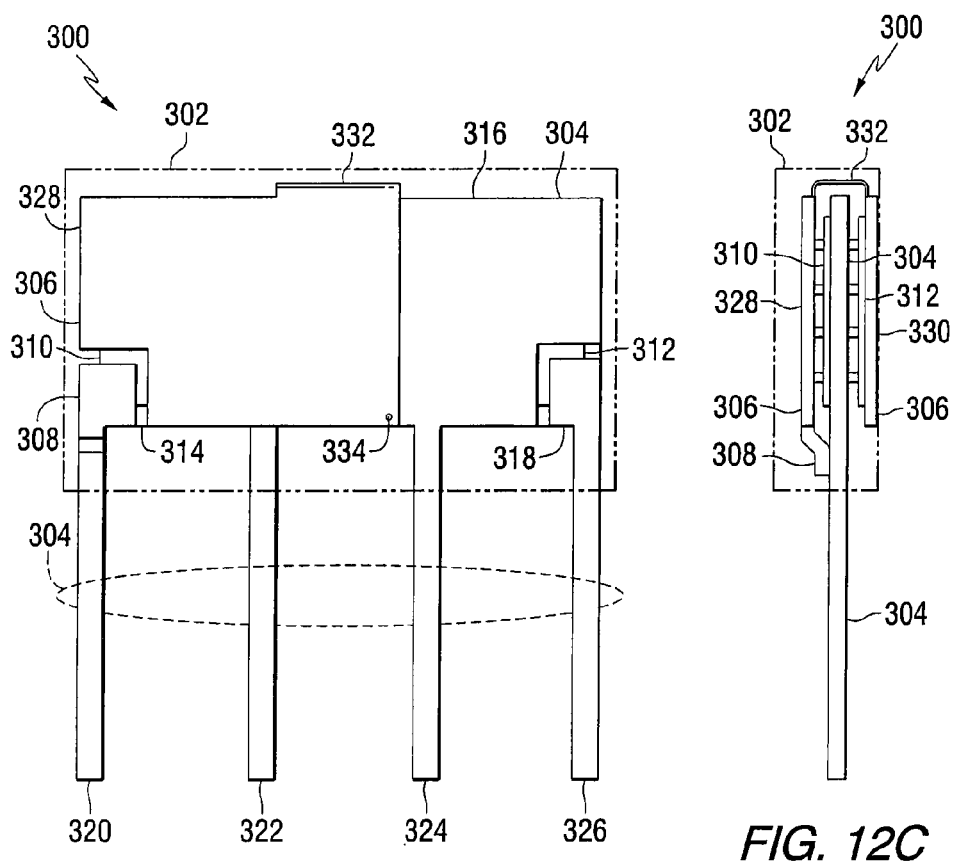
FIG. 12B
FIG. 12C

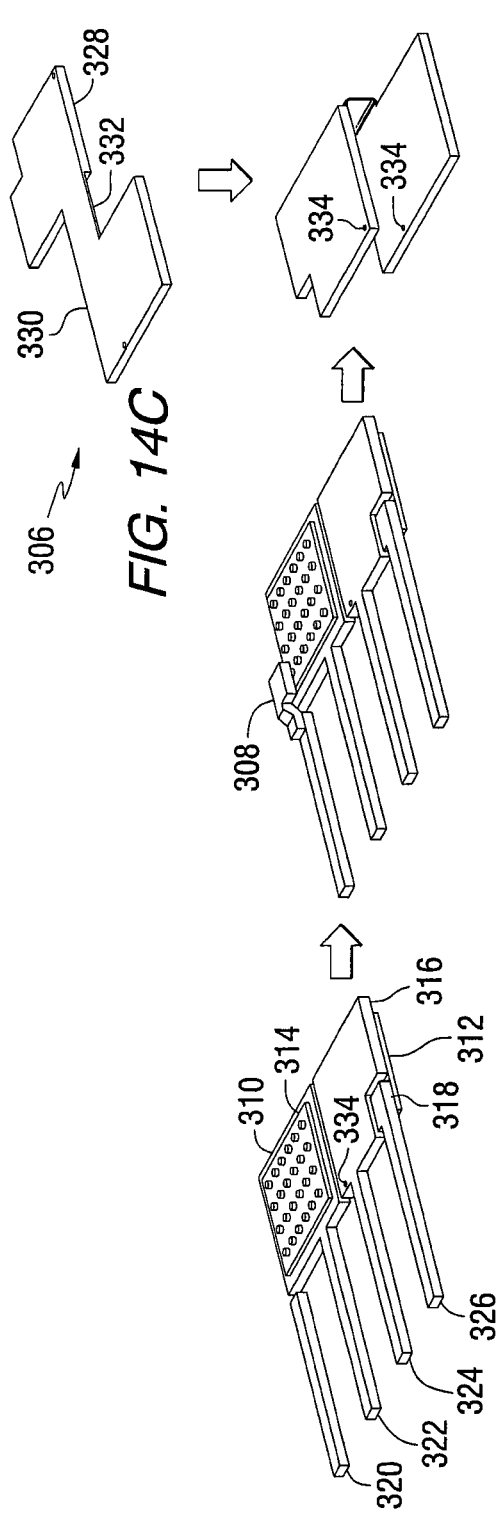

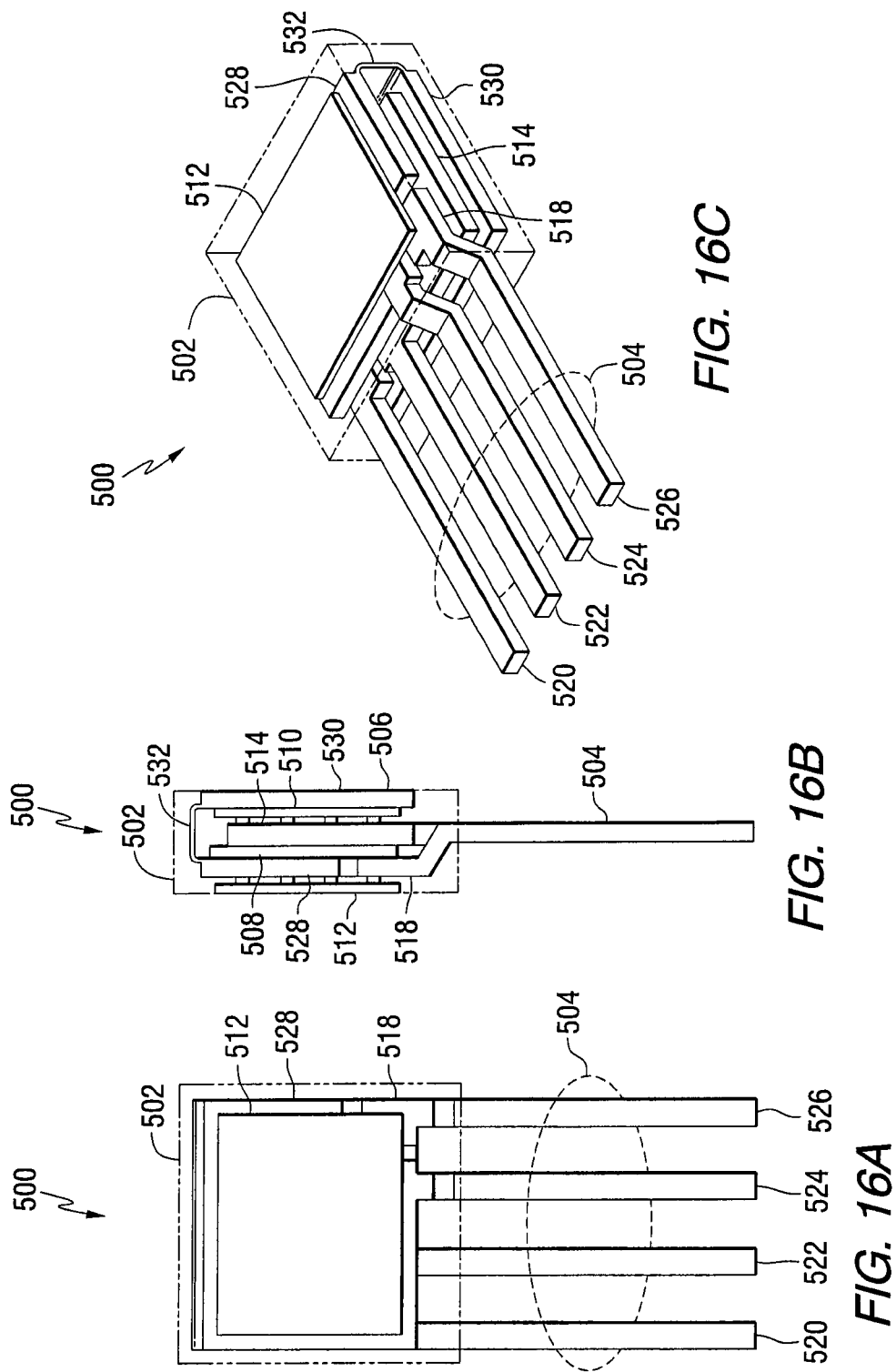

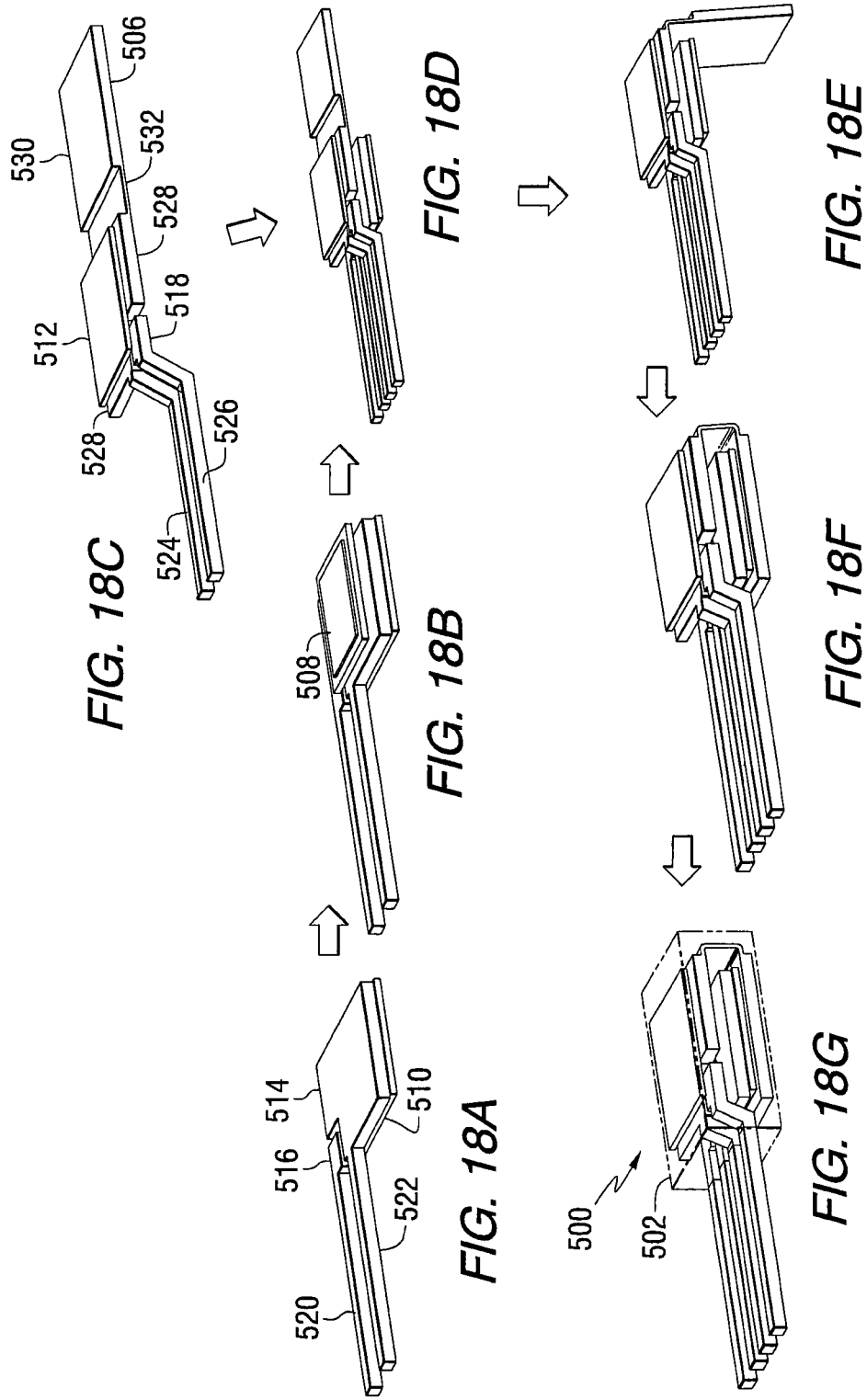

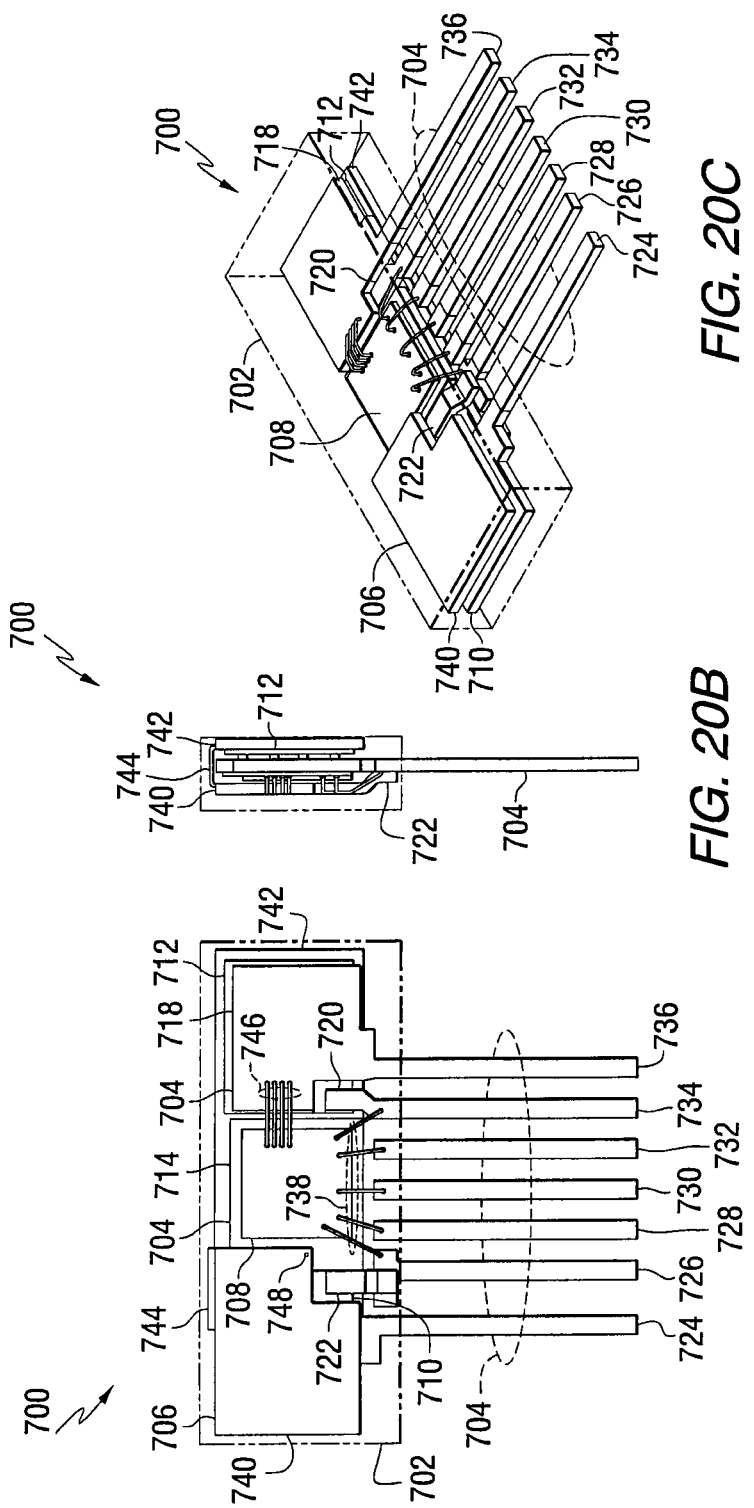

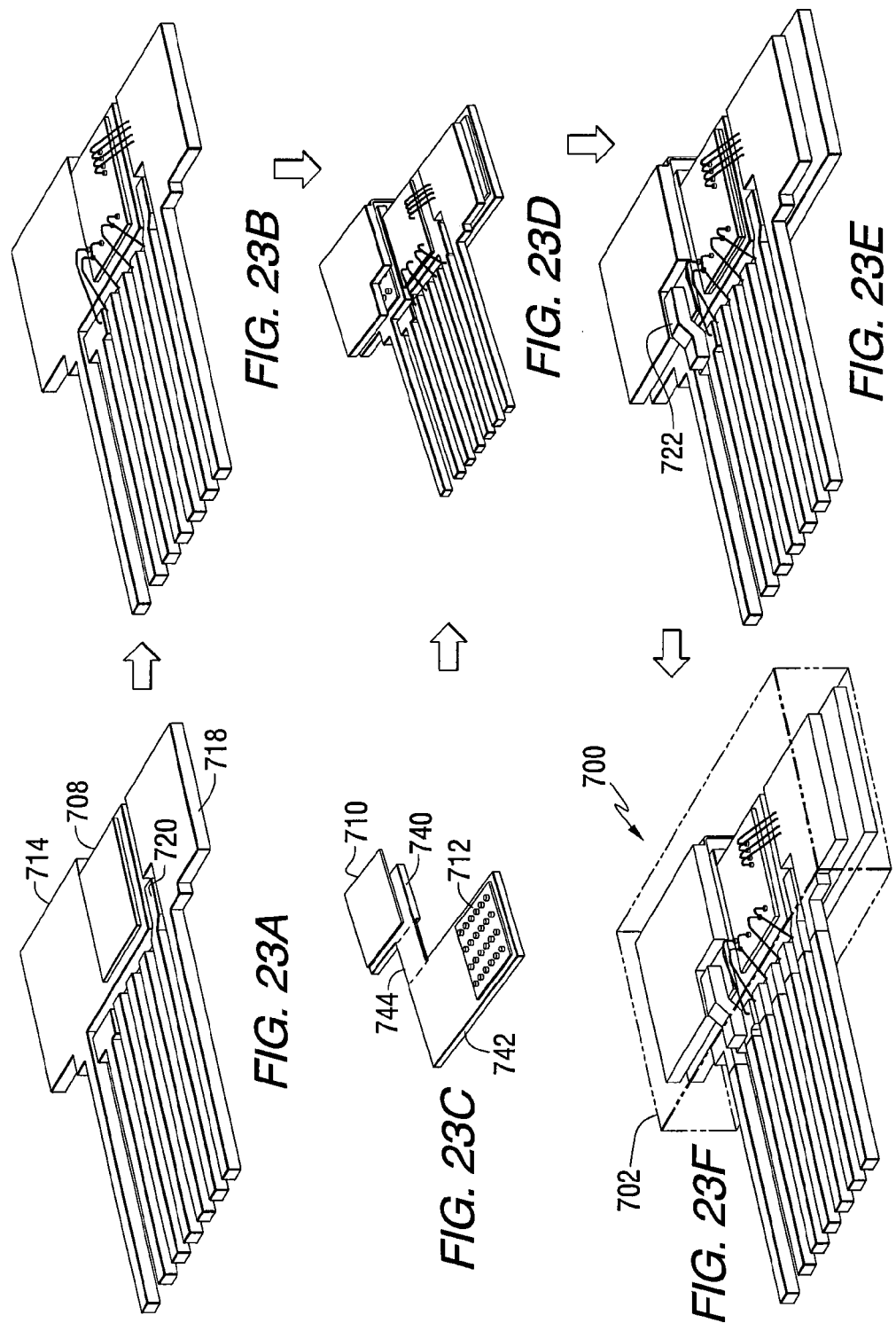

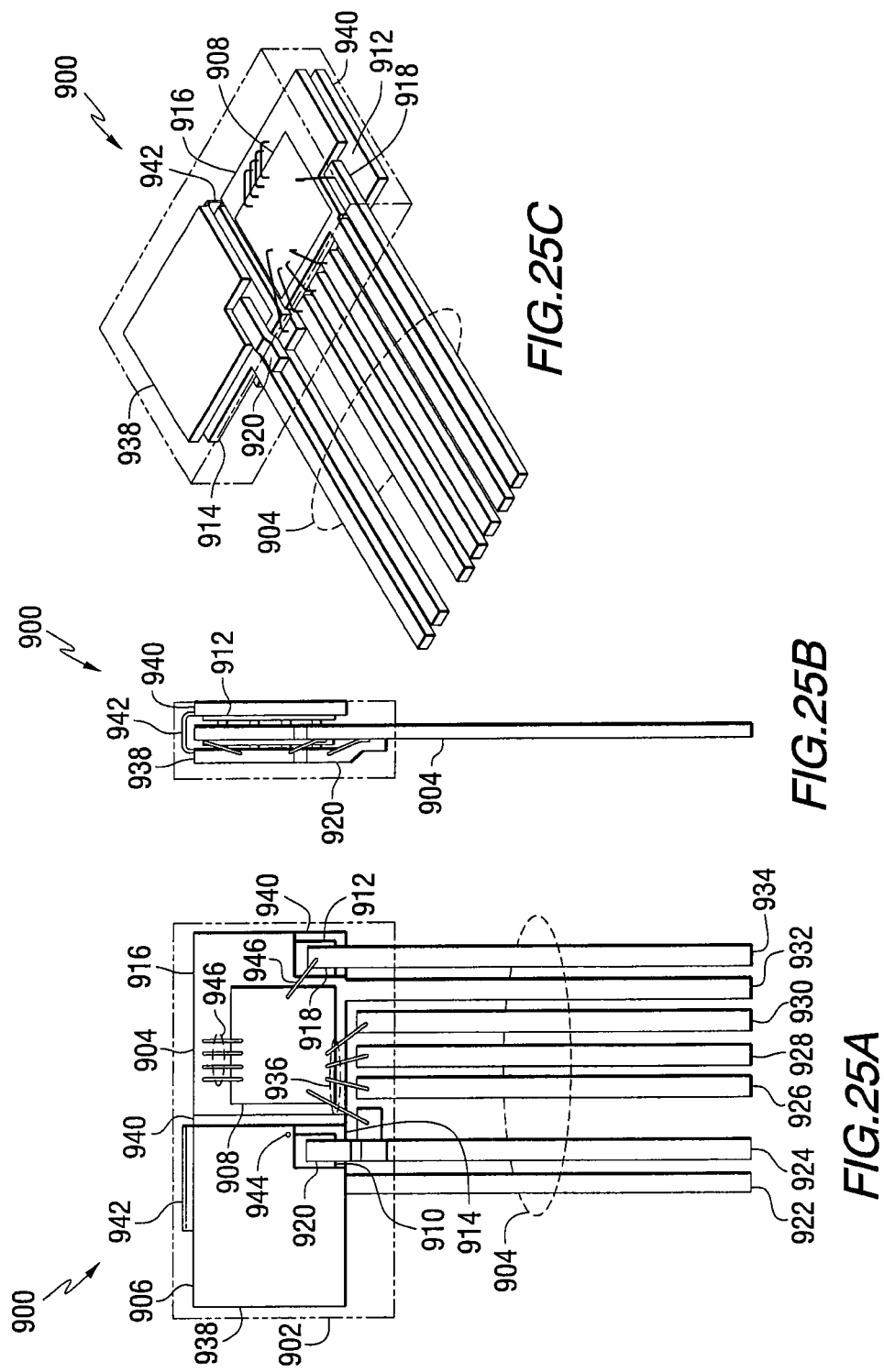

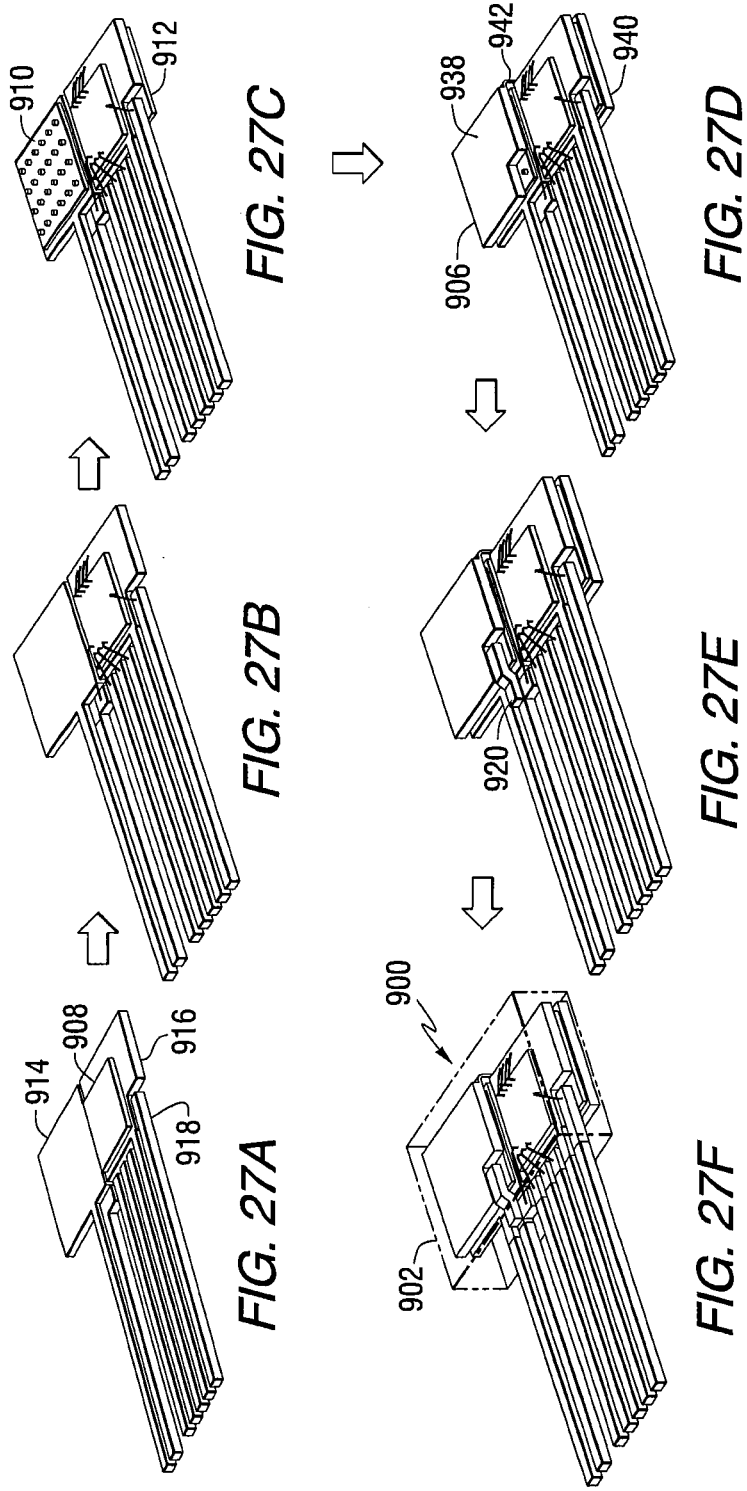

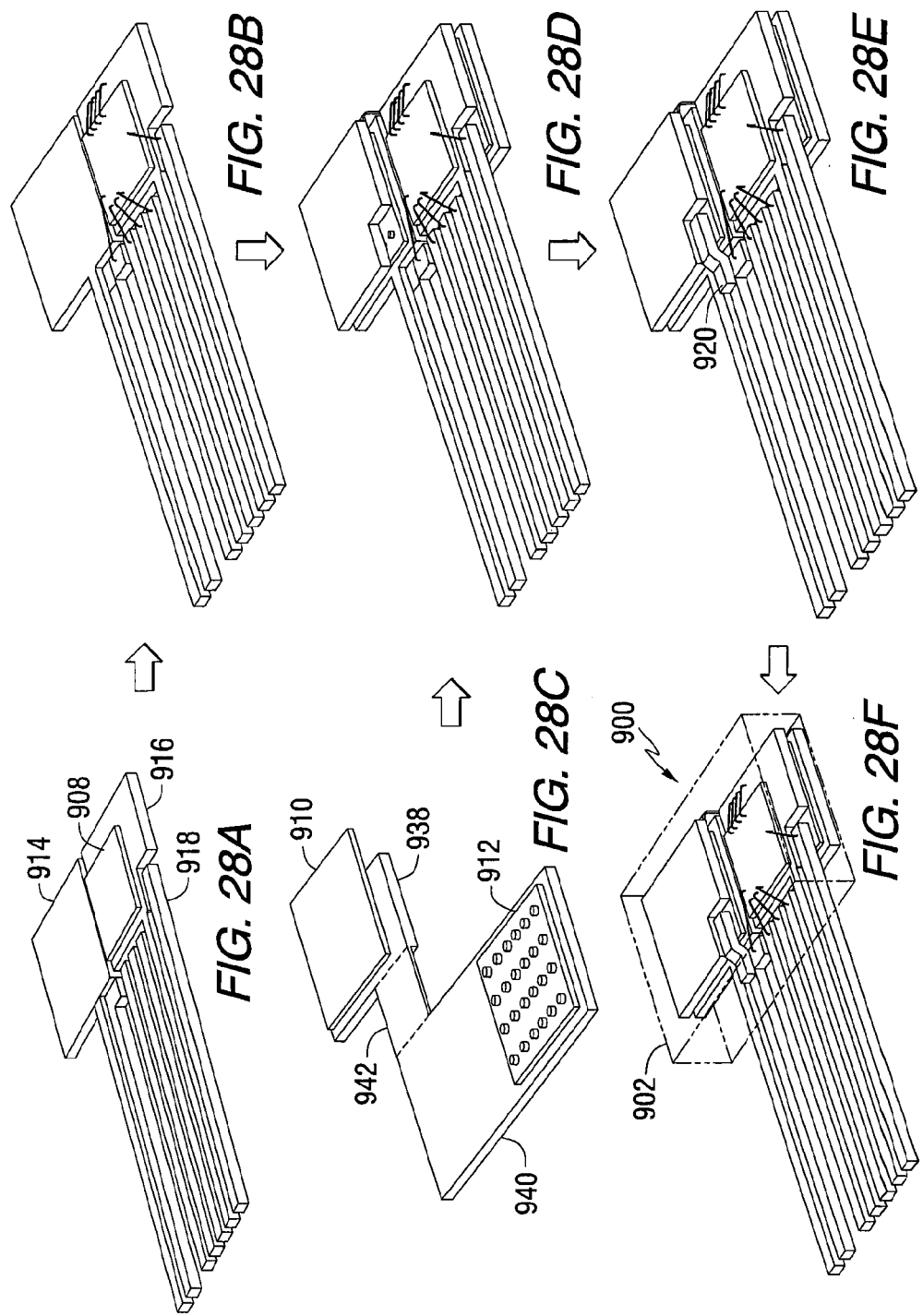

FOLDED LEADFRAME MULTIPLE DIE PACKAGE

CROSS-REFERENCE TO RELATED APPLICATIONS

This application is a divisional of U.S. patent application Ser. No. 12/025,798 filed Feb. 5, 2008, the specification of which is hereby incorporated in its entirety by reference.

FIELD OF THE INVENTION

This invention relates packages with multiple semiconductor dice, and more particularly, to packages with multiple power semiconductor dice.

BACKGROUND OF THE INVENTION

The layout design of circuits which involve the interconnection of power semiconductor die, such as synchronous buck converters for example, involves consideration of the voltage and current losses associated interconnecting the power semiconductor die. Multiple power semiconductor packages offer the benefit of short interconnects between the power devices. However, placing the multiple devices into a form factor that is easily attached to a printed circuit (PC) board together with minimizing the length of the interconnections and maximizing the cross sectional area of the interconnections to reduce the resistance and inductance of the interconnections in a package that can be economically produced is a goal of the design of multiple power semiconductor chips.

SUMMARY OF THE INVENTION

The present invention comprises in one embodiment thereof a multiple die package includes a folded leadframe having two plates connected by a belt member with a surface of each of the plates having the largest area being parallel with each other, a second leadframe positioned between the plates, and first and second die, each attached to the second leadframe and to one of the plates.

In another form of the present invention a multiple die package for a synchronous voltage converter comprising a folded leadframe having two plates connected by a belt member with a surface of each of the plates having the largest area being parallel with each other, a second leadframe positioned between the plates, and a high side die and a low side die, each attached to the second leadframe and to one of the plates.

In still another form of the present invention a multiple die package for a synchronous voltage converter having a folded leadframe having two plates connected by a belt member, a surface of each of the plates having the largest area being parallel with each other, a second leadframe positioned between the plates, a high side die and a low side die, each attached to the second leadframe and to one of the plates, and a driver integrated circuit (IC) connected to the high side die and the low side die.

In yet another form of the present invention a method for forming a multiple die package comprising the steps of attaching a first and second die to opposite sides of a first leadframe, forming a folded leadframe having parallel plates joined by a belt, and placing the first leadframe between the plates and attaching the first and second die to the plates.

In another form of the present invention a method is provided for forming a multiple die package for a synchronous voltage converter including the steps of attaching a high side and low side die to opposite sides of a first leadframe, forming a folded leadframe having parallel plates joined by a belt, and placing the first leadframe between the plates and attaching the low side and high side die to the plates.

In still another form of the present invention a method is provided for forming a multiple die package for a synchronous voltage converter including the steps of attaching a high side and low side die to opposite sides of a first leadframe, forming a folded leadframe having parallel plates joined by a belt, placing the first leadframe between the plates and attaching the low side and high side die to the plates, and attaching an integrated circuit (IC) to the first leadframe, and wire bonding the IC to the first leadframe.

BRIEF DESCRIPTION OF THE DRAWINGS

The aforementioned and other features, characteristics, advantages, and the invention in general will be better understood from the following more detailed description taken in conjunction with the accompanying drawings, in which:

FIGS. 1A, 1B, 1C and 1D are respective isometric, top, side, and isometric views of a folded leadframe stacked die package according to a first embodiment of the current invention with the encapsulating material shown in outline;

FIGS. 8A, 8B, 8C and 8D are respective top, side, isometric, and isometric views of a folded leadframe stacked die package according to a second embodiment of the current invention with the encapsulating material shown in outline;

FIGS. 9A, 9B, 9C, 9D, and 9E are isometric views showing the steps in forming the package shown in FIG. 8A;

FIGS. 11A, 11B, and 11C are respective isometric, isometric, and side views of a folded leadframe stacked die package according to another embodiment of the current invention with the encapsulating material shown in outline;

FIGS. 12A, 12B, and 12C are respective isometric, top, and side views of a folded leadframe stacked die package according to another embodiment of the current invention with the encapsulating material shown in outline;

FIGS. 14A, 14B, 14C, 14D, 14E, and 14F are isometric views showing the steps in forming the package shown in FIG. 12A;

FIGS. 16A, 16B, 16C and 16D are respective top, side, isometric, and isometric views of a folded leadframe stacked die package according to another embodiment of the current invention with the encapsulating material shown in outline;

FIGS. 18A, 18B, 18C, 18D, 18E, 18F, and 18G are isometric views showing the steps in forming the package shown in FIG. 16A;

FIGS. 20A, 20B, and 20C are respective top, side, and isometric views of a folded leadframe stacked die package according to another embodiment of the current invention with the encapsulating material shown in outline;

FIGS. 23A, 23B, 23C, 23D, 23E, and 23F are isometric views showing the steps in forming the package shown in FIG. 20A according to an embodiment of the present invention;

FIGS. 25A, 25B, and 25C are respective top, side, and isometric views of a folded leadframe stacked die package according to another embodiment of the current invention with the encapsulating material shown in outline;

FIGS. 27A, 27B, 27C, 27D, 27E, and 27F are isometric views showing the steps in forming the package shown in FIG. 25A according to an embodiment of the present invention;

FIGS. 28A, 28B, 28C, 28D, 28E, and 28F are isometric views showing the steps in forming the package shown in FIG. 25A according to an embodiment of the present invention;

Figure 1C:
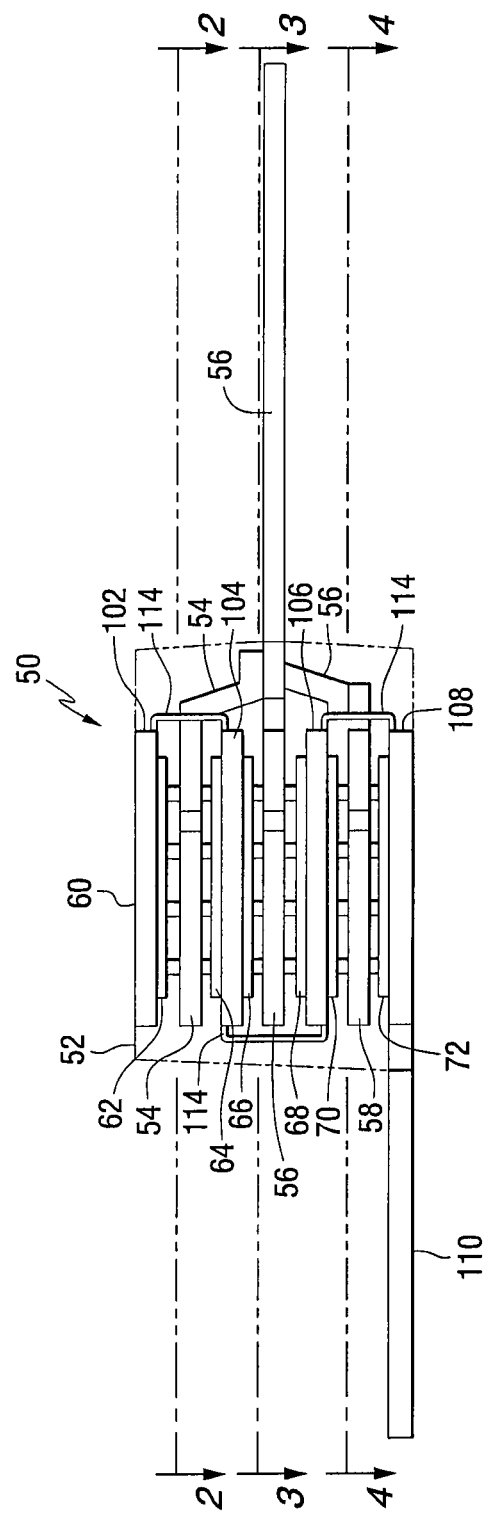
Figure 1D:
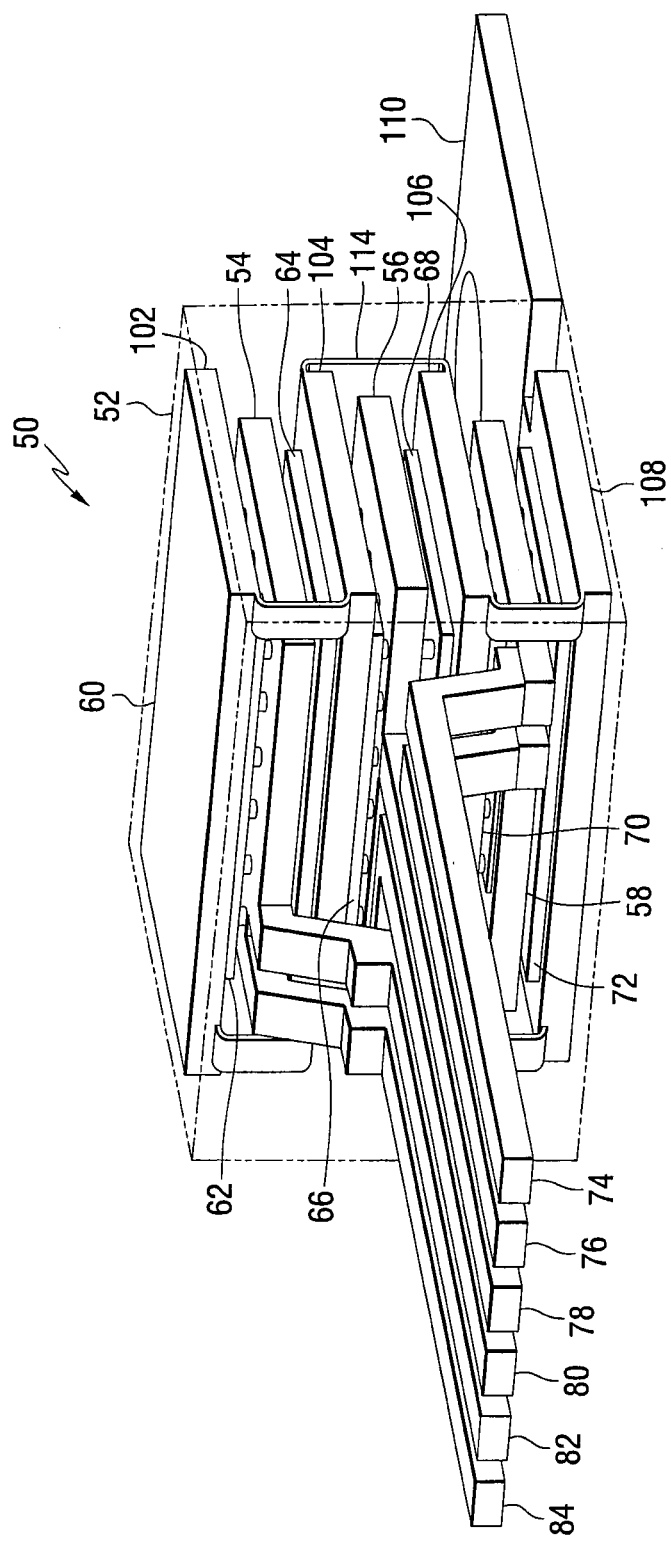

It will be appreciated that for purposes of clarity and where deemed appropriate, reference numerals have been repeated in the figures to indicate corresponding features. Also, the relative size of various objects in the drawings has in some cases been distorted to more clearly show the invention.

DETAILED DESCRIPTION

The present invention pertains to semiconductor packages with folded leadframes with multiple semiconductor devices. To facilitate the description of the invention, the semiconductor devices will be referred to as MOSFETs, although the present invention is not limited to such devices.

Turning now to the drawings, FIGS. 1-4 are various views of a folded leadframe multiple die package 50 according to a first embodiment of the present invention. In the drawings an encapsulating material 52 is shown in outline. The folded leadframe package 50 has four leadframes 54, 56, 58, and 60 and six MOSFETs 62, 64, 66, 68, 70, and 72 connected together. The leadframe 56 includes six external leads 74, 76, 78, 80, 82, and 84, with only external leads 78 and 80 connected to the die attach portion of the leadframe 56.

The leadframe 54 has a gate connection section 90 and a source connection section 92 which are attached to the respective gates and sources of the MOSFETs 62 and 64. The gate and source connection sections 90, 92 have stepped down portions which are attachment to the external leads 82 and 84, respectively. The leadframe 56 has a gate connection section 94 and a source connection section 96 which are attached to the respective gates and sources of the MOSFETs 66 and 68. The gate and source connection sections 94, 96 extend to form the external leads 78, 80, respectively. The leadframe 58 has a gate connection section 98 and a source connection section 100 which are attached to the respective gates and sources of the MOSFETs 70 and 72. The gate and source connection sections 98, 100 have extend in the direction of the external leads 74-80, and the external leads 76 and 74 have stepped down portions which are attached to the extended portions of the gate and source connections 98, 100, respectively.

The leadframe 60 has four die bond sections 102, 104, 106, and 108 and a metal tab section 110 which contains a mounting hole 112. Each of the five sections are connected together by two thinner belts 114. The five sections are connected to the drains of all MOSFETs. Since all the five sections are connected together, it is called common drain. The die bond section 102 is die bonded to the MOSFET 62, the die bond section 104 is die bonded to the MOSFETs 64 and 66, the die bond section 106 is die bonded to the MOSFETs 68 and 70, and the die bond section 108 is die bonded to the MOSFET 72.

The lead frames 54, 56, 58, and the die bond sections of leadframe 60 have alignment holes 116 which are used to align the four leadframes during the assembly process of the folded leadframe package 50.

Figure 2:
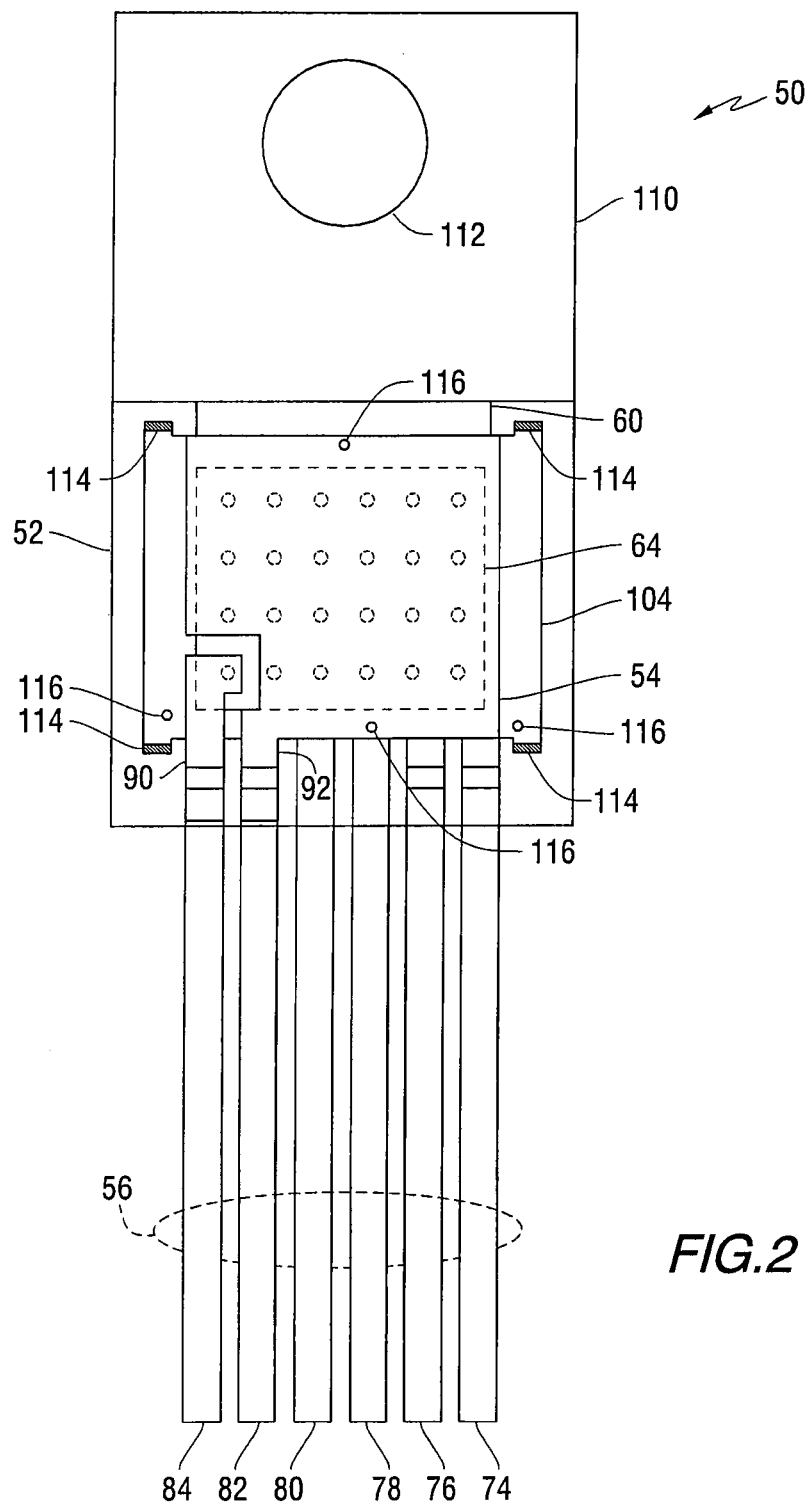
FIG. 2 is a cross sectional view taken along line 2-2 in FIG. 1C.
Figure 3:
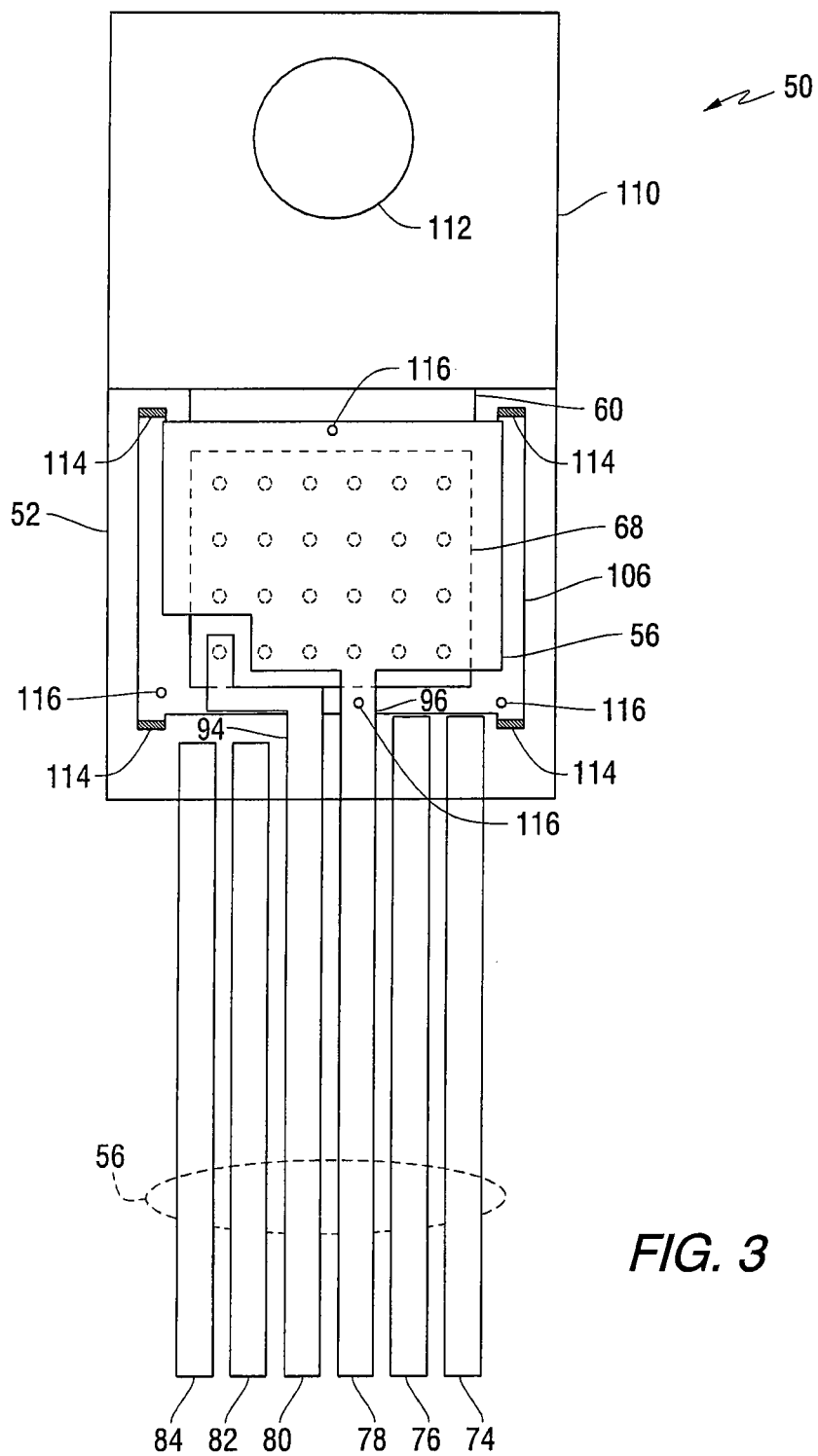
FIG. 3 is a cross sectional view taken along line 3-3 in FIG. 1C.
Figure 4:
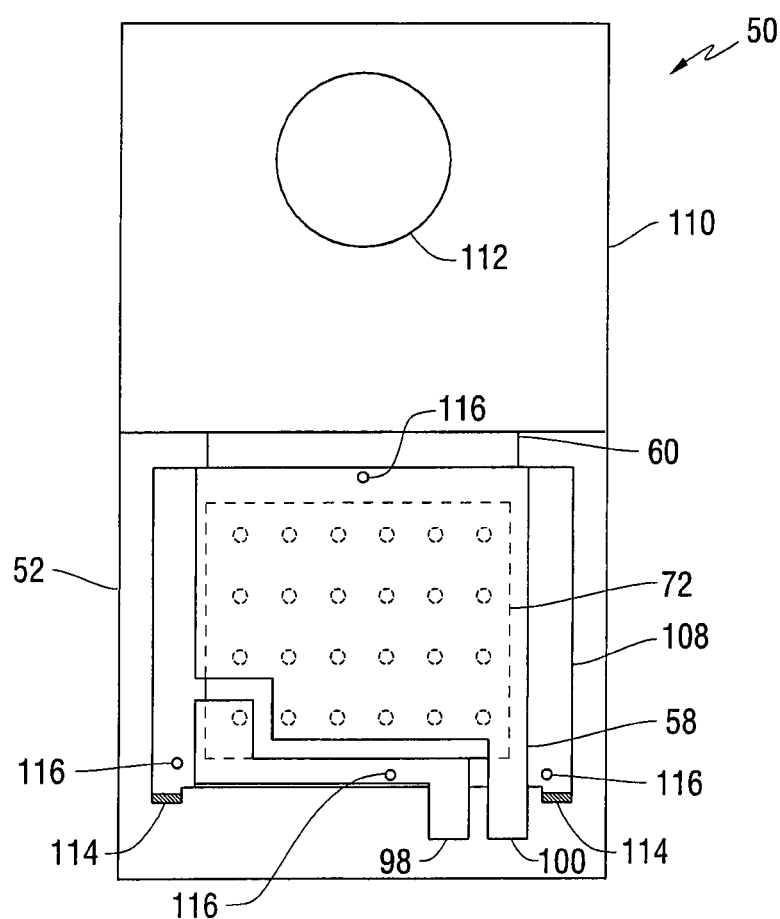
FIG. 4 is a cross sectional view taken along line 4-4 in FIG. 1C.

FIG. 2 is a top cross section taken along line 2-2 in FIG. 1C, FIG. 3 is a top cross section taken along line 3-3 in FIG. 1C, and FIG. 4 is a top cross section taken along line 4-4 in FIG. 1C.

Figure 5:
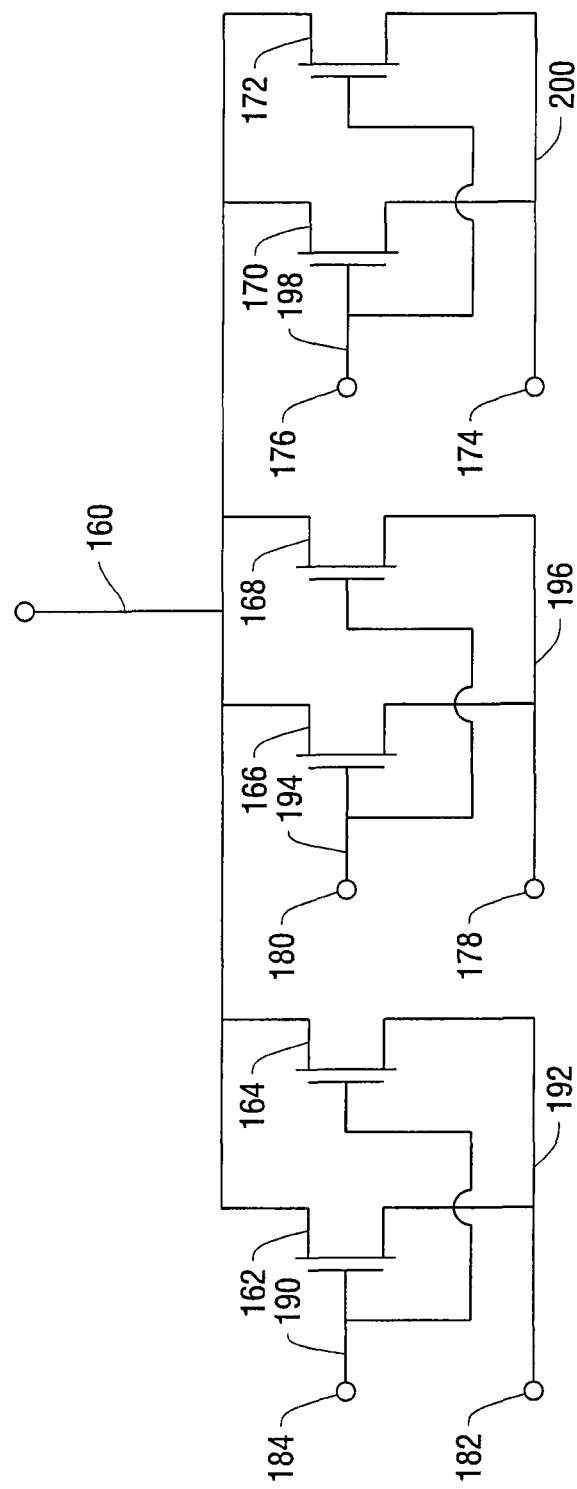
FIG. 5 is a schematic diagram of the interconnections of the die in the folded leadframe stacked die package shown in FIG. 1A.

FIG. 5 is a schematic diagram of the folded leadframe package 50 when vertical MOSFETs are used for the MOSFETs 62-72. The following table shows the correspondence between the package 50 reference numbers and the schematic reference numbers in FIG. 5:

| Reference Nos. in the drawings for the Package 50 | Schematic Reference Nos. in FIG. 5 |
|---|---|
| 60 | 160 |
| 62 | 162 |
| 64 | 164 |
| 66 | 166 |
| 68 | 168 |
| 70 | 170 |
| 72 | 172 |
| 74 | 174 |
| 76 | 176 |
| 78 | 178 |
| 80 | 180 |
| 82 | 182 |
| 84 | 184 |
| 90 | 190 |
| 92 | 192 |
| 94 | 194 |
| 96 | 196 |
| 98 | 198 |
| 100 | 200 |

Figure 6:
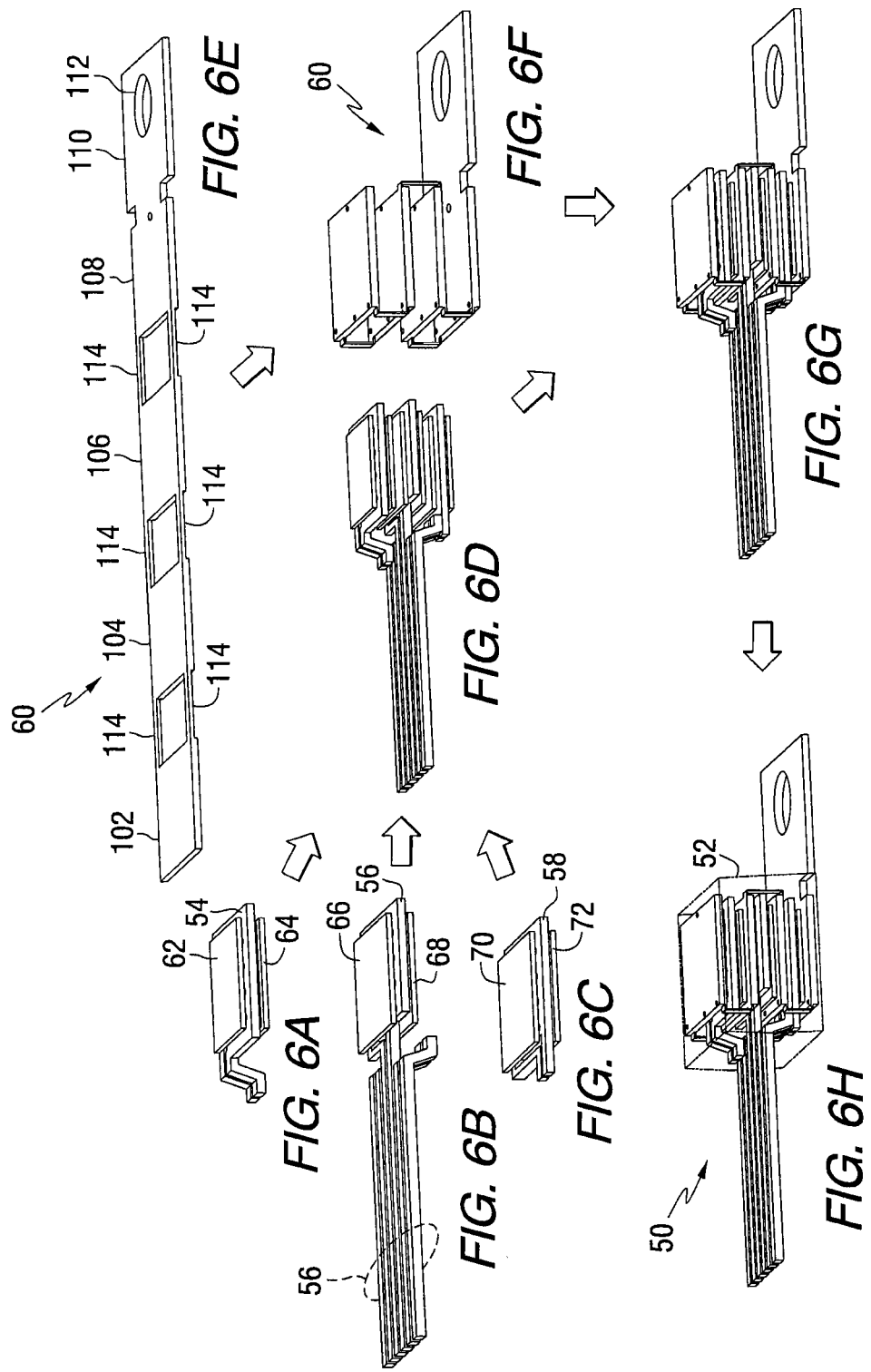
FIGS. 6A, 6B, 6C, 6D, 6E, 6F, 6G, and 6H are isometric views showing the steps in forming the package shown in FIG. 1A.

FIGS. 6A-6H show the various steps in assembling the folded leadframe package 50 according to an embodiment of the present invention. FIG. 6A shows a subassembly with MOSFETs 62 and 64 attached to the leadframe 54, FIG. 6B shows another subassembly with MOSFETs 66 and 68 attached to the leadframe 56, and FIG. 6C shows another subassembly with MOSFETs 70 and 72 attached to the leadframe 58. These three subassemblies are formed into another subassembly shown in FIG. 6D. FIG. 6E shows the leadframe 60 prior to being folded, and FIG. 6F shows the leadframe 60 after it has been folded. The subassembly shown in FIG. 6D is inserted into the folded leadframe 60 and the MOSFETs 62-72 are die bonded to the plates 102-108 of the folded leadframe 60 to form the folded leadframe package 50 prior to encapsulation as shown in FIG. 6G. After encapsulation the completed folded leadframe package 50 is shown in FIG. 6H. The folded leadframe 60 is an integral unit meaning that it is formed from a single piece of material.

Figure 7:
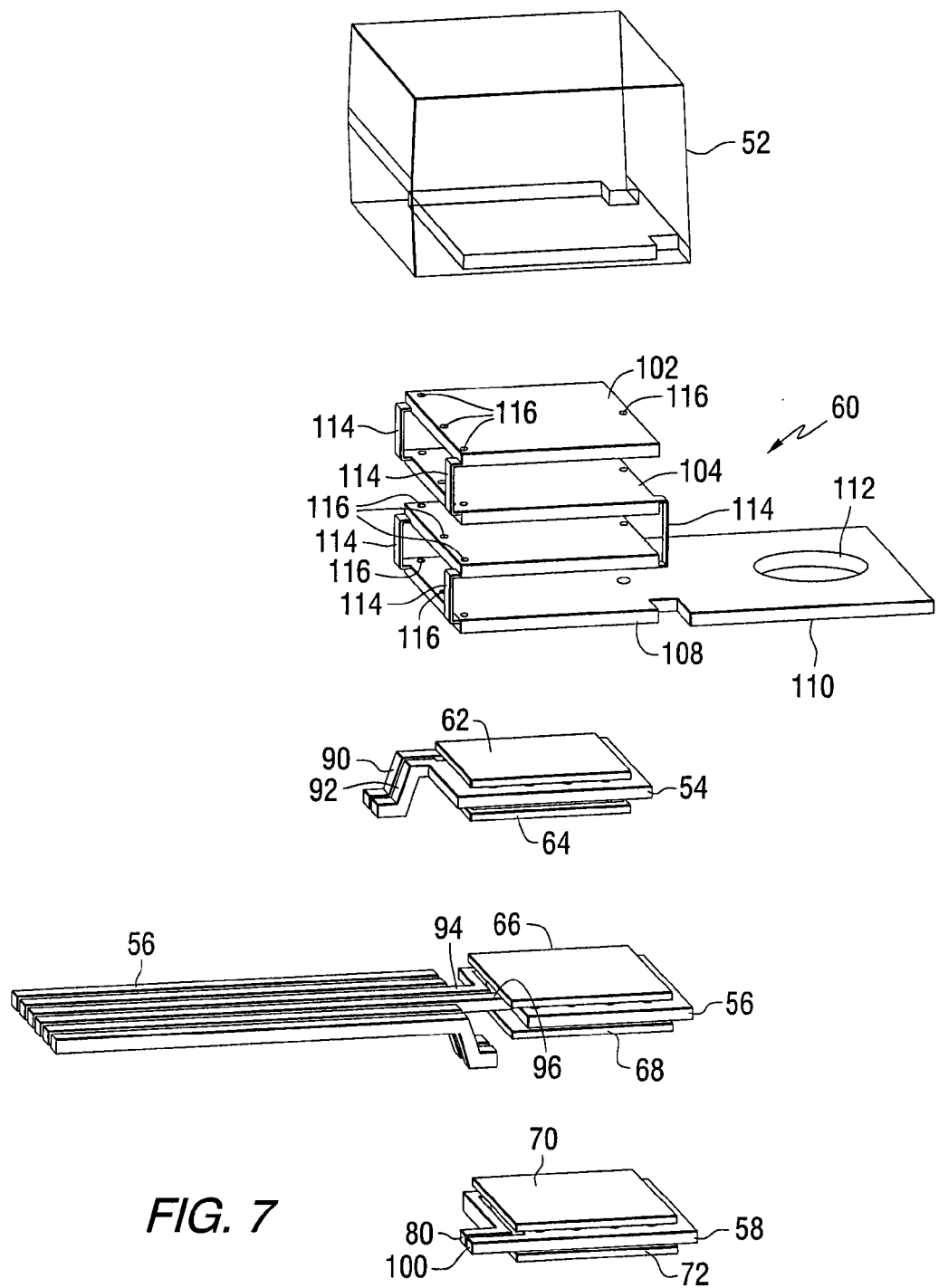
FIG. 7 is an exploded view of the package shown in FIG. 1A.
Figure 8D:
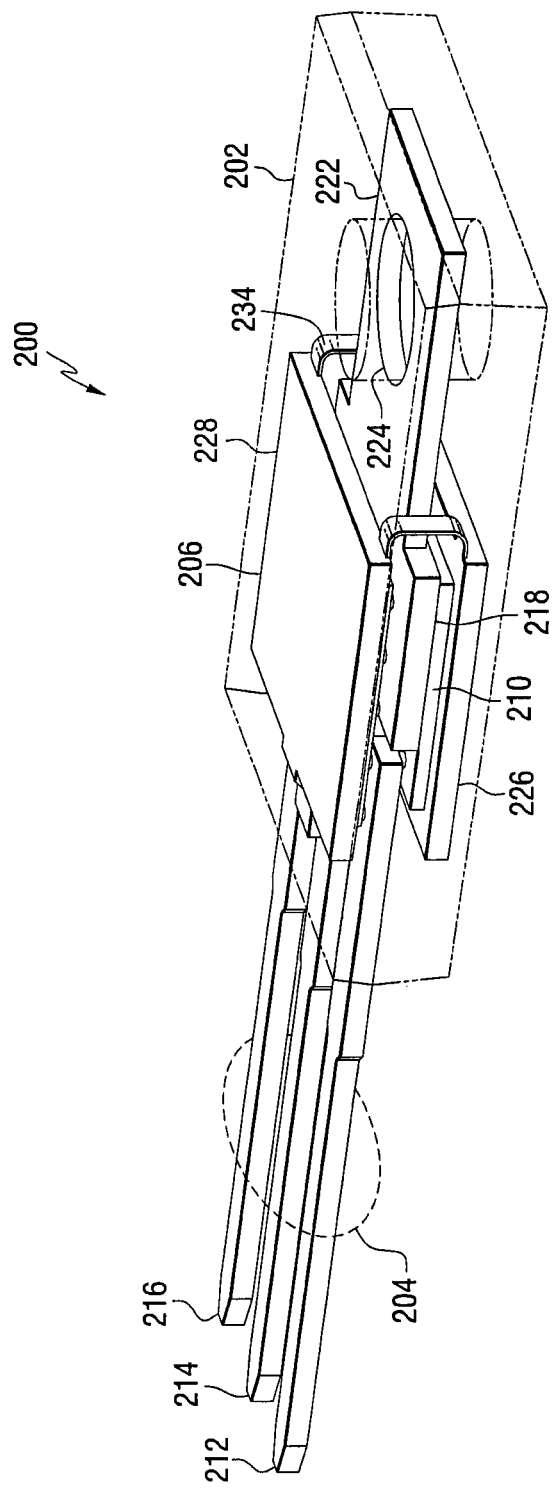

FIG. 7 is an exploded view of the folded leadframe package 50.

FIGS. 8A, 8B, 8C, and 8D are top (FIG. 8A), side (FIG. 8B), and isometric (FIGS. 8C and 8D) views of a folded leadframe multiple die package 200 according to a second embodiment of the present invention. In the drawings an encapsulating material 202 is shown in outline. The folded leadframe package 200 has two leadframes 204 and 206 and two MOSFETs 208 and 210 connected together. The leadframe 204 includes three external leads 212, 214, and 216, with external lead 212 connected to a section of the die attach portion 218 of the lead frame 204 connected to the sources of the MOSFETs 208 and 210, and the external lead 216 connected to a section of the die attach portion 218 of the lead frame 204 connected to the gates of the MOSFETs 208 and 210. The leadframe 204 also has a metal tab connector 222 which has a mounting hole 224 formed therein. The metal tab 222 is encapsulated by the encapsulating compound 202 with holes in the encapsulating compound aligned with the mounting hole 224. The leadframe 206 has two die bond sections 226 and 228, both of which have stepped tabs 230 and 232, respectively, which attach to the external lead 214 connected to the common drain of MOSFETs 208 and 210. The two die bond sections 226, 228 are connected together by two thinner belts 234. The die bond section 226 is die bonded to the MOSFET 208, the die bond section 228 is die bonded to the MOSFET 210.

The die attach portion of the lead frame 204 and the die bond sections of leadframe 206 have alignment holes 236 which are used to align the two leadframes during the assembly process of the folded leadframe package 200.

FIGS. 9A-9D show the various steps in assembling the folded leadframe package 50 according to an embodiment of the present invention. FIG. 9A shows a subassembly with MOSFETs 208 and 210 attached to the leadframe 204. FIG. 9B shows the leadframe 206 prior to being folded, and FIG. 9C shows the folded leadframe 206. The subassembly shown in FIG. 9A is inserted into the folded leadframe 206, the plates 226, 228 of the folded leadframe 206 are die attached to the MOSFETs 208,210, and the tabs 230, 232 of the folded leadframe 206 are attached to the external lead 214 of the subassembly shown in FIG. 9A to form the folded leadframe package 200 prior to encapsulation shown in FIG. 9D. After encapsulation the completed folded leadframe package 200 is shown in FIG. 9E.

Figure 10:
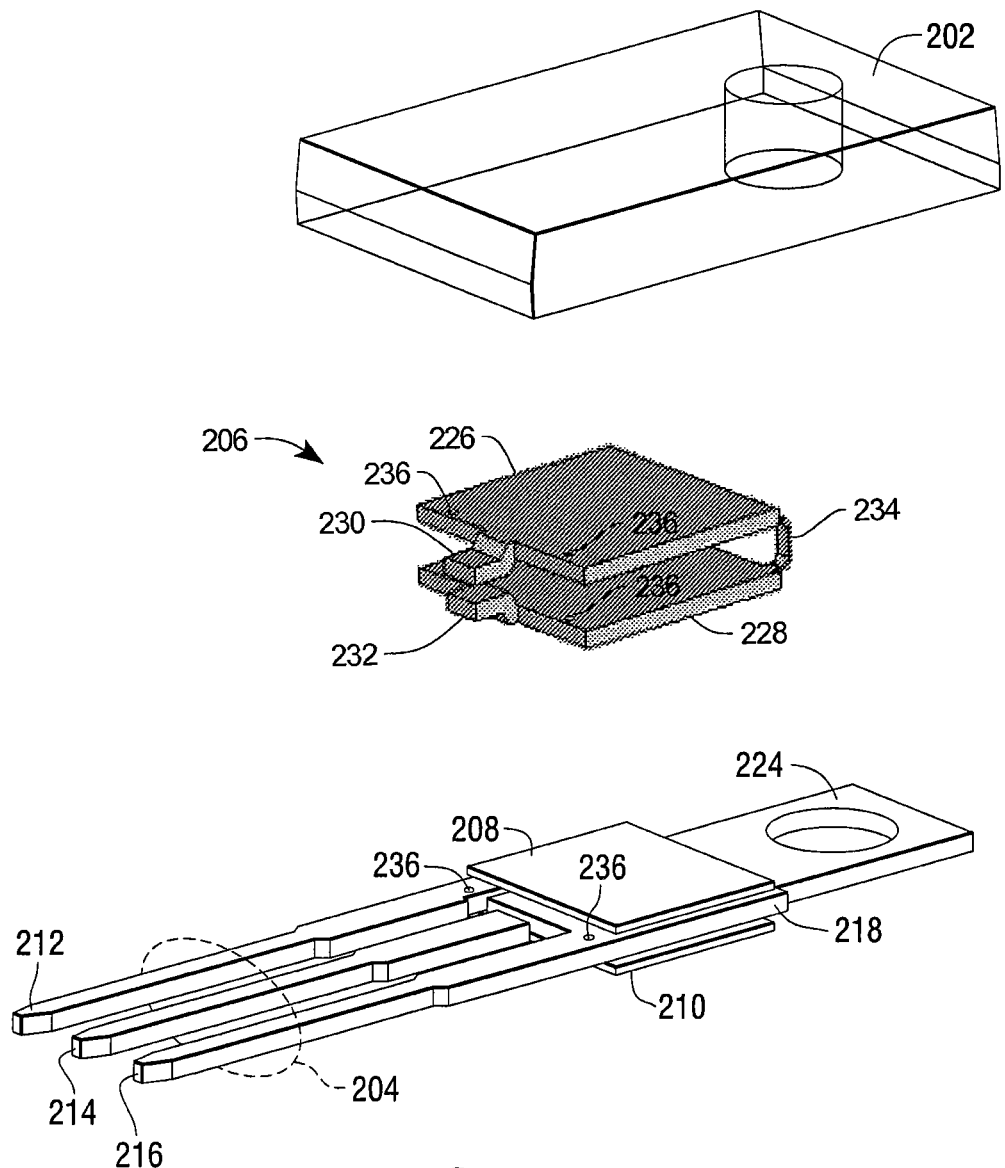
FIG. 10 is an exploded view of the package shown in FIG. 8A.

FIG. 10 is an exploded view of the folded leadframe package 200.

FIGS. 11A, 11B and 11(C) are two isometric views (11A and 11B) and a side view (11C) of a variation of the embodiment of the present invention shown in FIGS. 9A-9D. In FIGS. 11A-11C two double bonded ceramic (DBC) plates 238 have been attached to the outer surfaces of the die bonding sections 226, 228 and their outer surfaces are exposed (i.e., not encapsulated) to provide improved heat transfer from the two MOSFETs 208, 210 to the outside of the folded leadframe package 200.

FIGS. 12A, 12B, and 12C are respective top, side, and isometric views of a folded leadframe multiple die package 300 according to another embodiment of the present invention. In the drawings an encapsulating material 302 is shown in outline. The folded leadframe package 300 has two leadframes 304 and 306, a gate clip 308, and two MOSFETs 310 and 312 connected together in a manner to form a synchronous voltage regulator. The leadframe 304 has a die bond section 314, a source attach section 316, and a gate attachment section 318, and also includes four external leads 320, 322, 324, and 326. The external lead 320 is isolated from the other sections of the leadframe 304, the external lead 322 is connected to the die bond section 314 of the leadframe 304, the external lead 324 is connected to the source attach section 316 of the leadframe 304, and the external lead 326 is connected to the gate attachment section 318 of the leadframe 304. The leadframe 306 is a folded leadframe with a source attach plate 328, a die bond plate 330, and a thinner belt 332 connected between the two plates 328, 330. The die bond section 314 of the leadframe 304 is die bonded to the MOSFET 310 and the die bond plate 330 of the leadframe 306 is die bonded to the MOSFET 312. The die attach section 316 of the leadframe 304 is attached to the source of the MOSFET 312 and the die attach plate 328 of the leadframe 306 is attached to the source of the MOSFET 310.

The outside surface of the die bond plate 330 is exposed and thereby enhances the heat dissipation generated by the MOSFETs 310 and 312. The exposed surface of the die bond plate 330 allows a connection to be made to the common node of the drain of the MOSFET 312 and the source of the MOSFET 310 rather than through an external lead.

As shown in FIGS. 14A-14F the source attach plate 328 and the die bond plate 330 of the lead frame 306 and the die attach section 314 of the leadframe 304 have alignment holes 334 which are used to align the two leadframes during the assembly process of the folded leadframe package 300.

Figure 13:
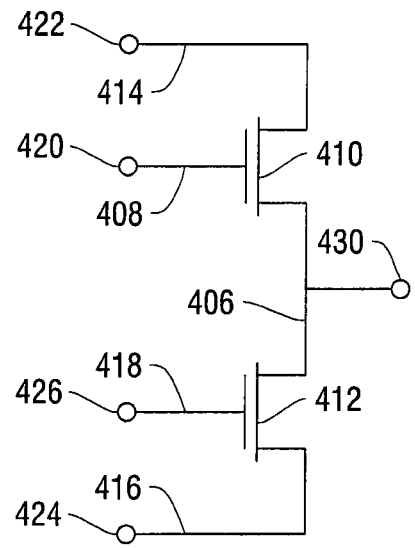
FIG. 13 is a schematic diagram of the interconnections of the die in the folded leadframe stacked die package shown in FIG. 12A.

FIG. 13 is a schematic diagram of the synchronous voltage regulator contained in the folded leadframe package 300 when vertical MOSFETs are used for the MOSFETs 310, 312. The following table shows the correspondence between the leadframe drawings reference numbers and the schematic reference numbers:

| Reference Nos. in the drawings for the Package 300 | Schematic Reference Nos. in FIG. 13 |
| --- | --- |
| 306 | 406 |
| 308 | 408 |
| 310 | 410 |
| 312 | 412 |
| 314 | 414 |
| 316 | 416 |
| 318 | 418 |
| 320 | 420 |
| 322 | 422 |
| 324 | 424 |
| 326 | 426 |
| 330 | 430 |

FIGS. 14A-14F show the various steps in assembling the folded leadframe package 300 according to an embodiment of the present invention. FIG. 14A shows a subassembly with MOSFET 310 die bonded to the die bond section 314, and MOSFET 312 attached to the source attach section 316 and the gate attachment section 318 of the leadframe 304. FIG. 14B shows the subassembly of FIG. 14A with the gate clip 308 attached. FIG. 14C shows the leadframe 306 prior to being folded, and FIG. 14D shows the leadframe 306 after it has been folded. The subassembly shown in FIG. 14B is inserted into the folded leadframe 306 and the source of MOSFET 310 is attached to plate 328 of the folded leadframe 306, and the MOSFET 312 is die bonded to the plate 330 to form the folded leadframe package 300 prior to encapsulation as shown in FIG. 14E. After encapsulation the completed folded leadframe package 300 is shown in FIG. 14F.

Figure 15:
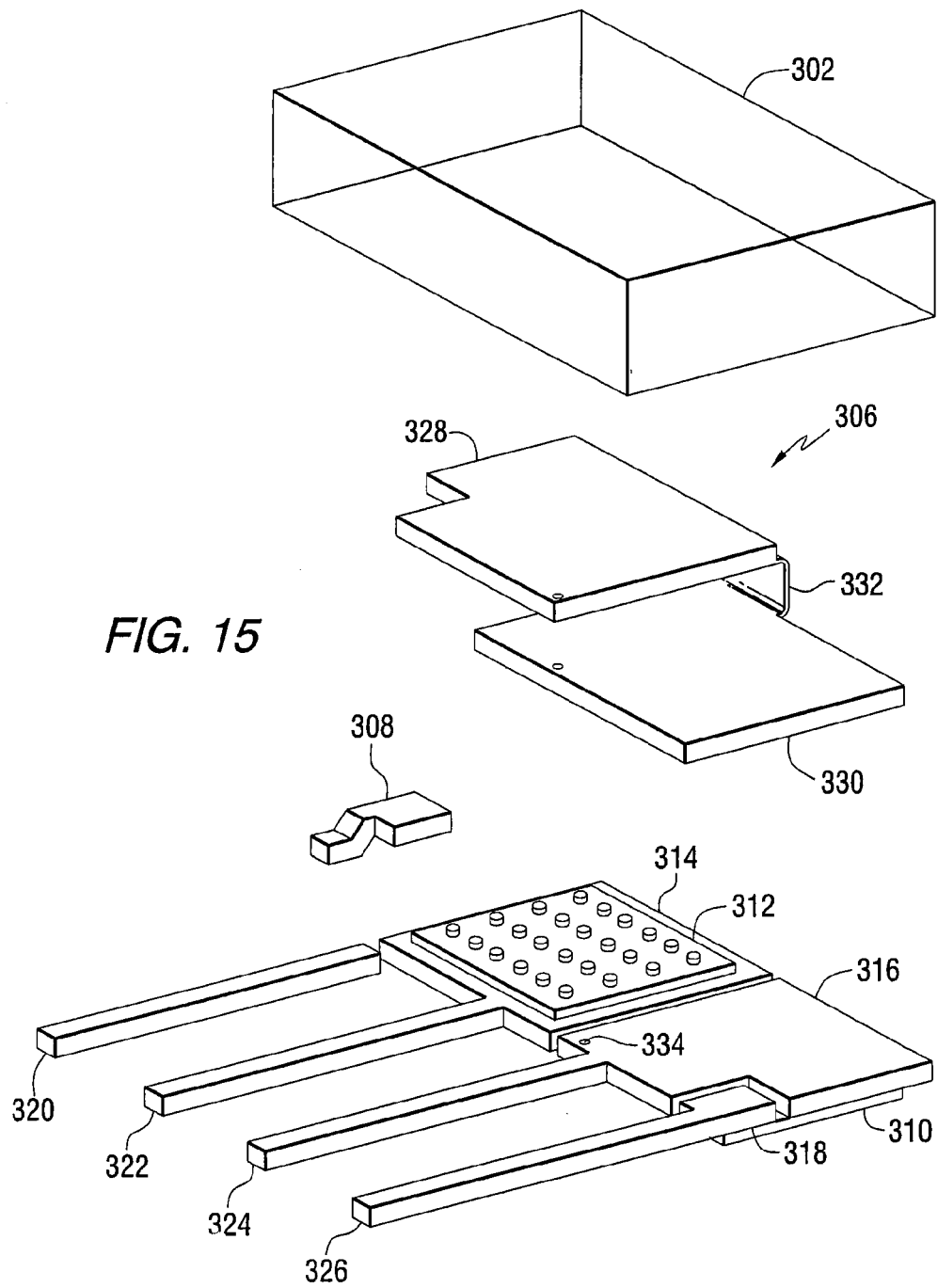
FIG. 15 is an exploded view of the package shown in FIG. 12A.
Figure 16D:
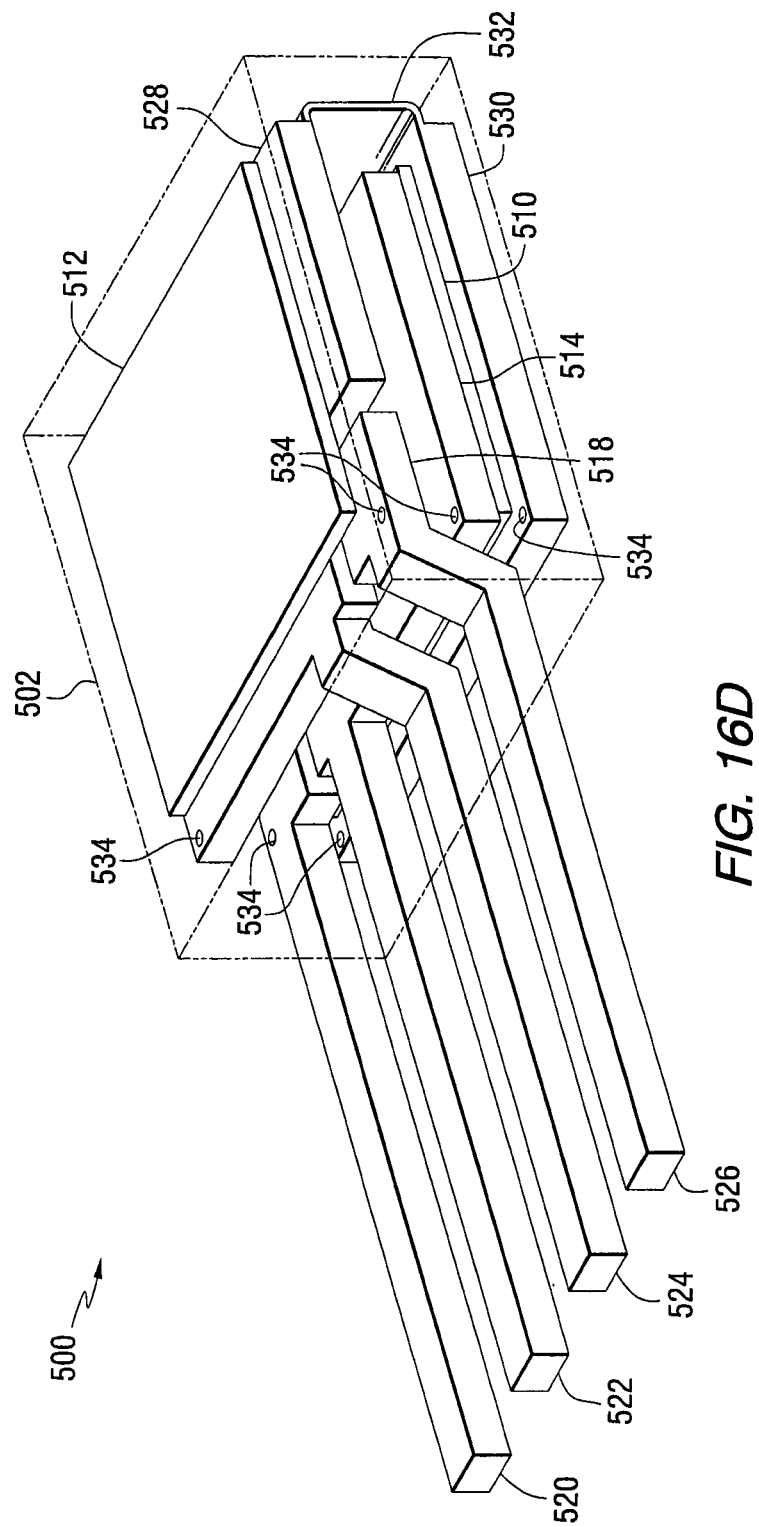

FIG. 15 is an exploded view of the folded leadframe package 300.

FIGS. 16A, 16B, 16C, and 16D are respective top (FIG. 16A), side (FIG. 16B), and isometric (FIGS. 16C and 16D) views of a folded leadframe multiple die package 500 according to another embodiment of the present invention. In the drawings an encapsulating material 502 is shown in outline. The folded leadframe package 500 has two leadframes 504 and 506, a double bonded ceramic (DBC) plate 508, and two MOSFETs 510 and 512 connected together in a manner to also form a synchronous voltage regulator. The leadframe 504 has a source attach section 514, and a gate attach section 516, and also includes two external leads 520 and 522. The external lead 520 is connected to, and in the same plane as, the gate attach section 516, and the external lead 522 is connected to, and in the same plane as, the source die attach section 514.

The leadframe 506 is a folded leadframe with the source attach plate 528, a die bond plate 530, and a thinner belt 532 connected between the two plates 528, 530 such that the two plates 528, 530 can be folded into two parallel, stacked plates. The leadframe 506 also includes a gate attach section 518 and two external leads 524 and 526. The external lead 524 is in the same plane as the external leads 520 and 522 in the areas in which the external leads are not encapsulated, but is stepped up in the encapsulated region of the folded leadframe multiple die package 500 where it is connected to the source attach plate 528 of leadframe 506, and the external lead 526 and is connected to the gate attach section 518.

Figure 19:
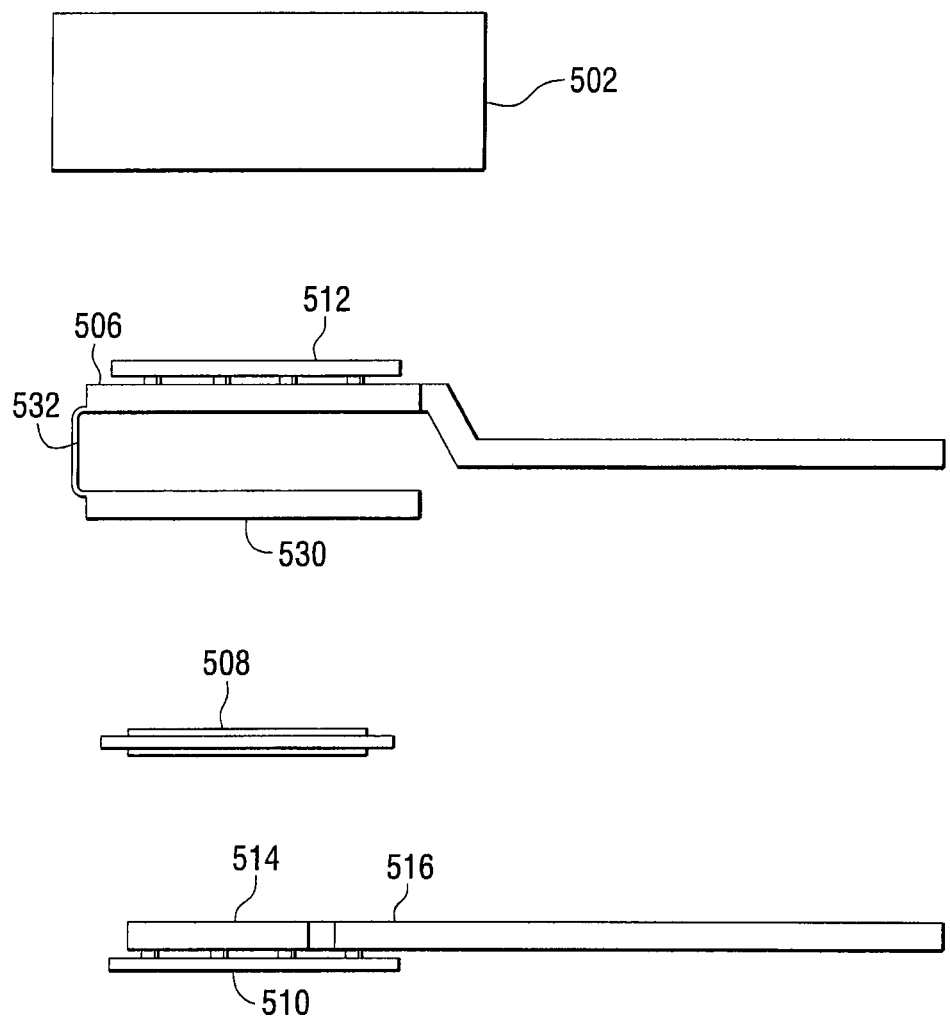
FIG. 19 is an exploded view of the package shown in FIG. 16A.

The source attach section 514 of the leadframe 504 is attached to the source of the MOSFET 510 and the gate attach section 516 is attached to the gate of the MOSFET 510. The gate attach section 518 of the leadframe 506 is attached to the gate of the MOSFET 512. The source attach plate 528 of the leadframe 506 is attached to the source of the MOSFET 512, and the die bond plate 530 is die bonded to the MOSFET 510. As best shown in FIGS. 18-19, the BDC plate 508 is attached between the top of the source attach section 514 of the leadframe 504 and bottom of the source attach plate 528 of the leadframe 506 to electrically isolate the two leadframes.

The outside (drain) of the MOSFET 512 and the outside of the die bond plate 530 are exposed and thereby enhance the heat dissipation generated by the MOSFETs 510 and 512. The outside of the MOSFET 512 allows a connection to be made to the drain of the MOSFET 512 rather than through an external lead.

The die attach plate 528 and the die bond plate 530 of the lead frame 506, and the source attach section 514, and the two gate attach sections 516 and 518 of the leadframe 504 have alignment holes 534 which are used to align the two leadframes during the assembly process of the folded leadframe package 500.

Figure 17:
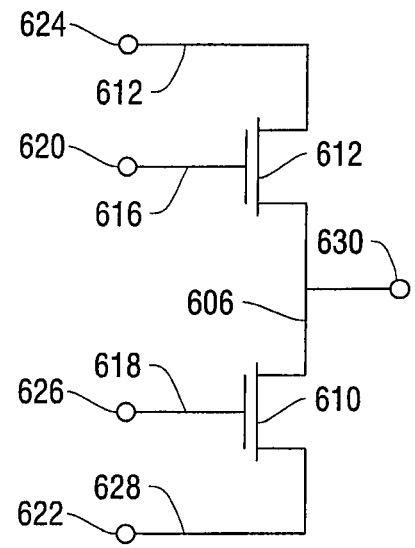
FIG. 17 is a schematic diagram of the interconnections of the die in the folded leadframe stacked die package shown in FIG. 16A.

FIG. 17 is a schematic diagram of the synchronous voltage regulator contained in the folded leadframe package 500 when vertical MOSFETs are used for the MOSFETs 510, 512. The following table shows the correspondence between the leadframe drawings reference numbers and the schematic reference numbers:

| Reference Nos. in the drawings for the Package 500 | Schematic Reference Nos. in FIG. 17 |
|---|---|
| 506 | 606 |
| 510 | 610 |
| 512 | 612 |
| 516 | 616 |
| 518 | 618 |
| 520 | 620 |
| 522 | 622 |
| 524 | 624 |
| 526 | 626 |
| 528 | 628 |
| 530 | 630 |

FIGS. 18A-18G show the various steps in assembling the folded leadframe package 500 according to an embodiment of the present invention. FIG. 18A shows a subassembly with MOSFET 510 attached to the source attach section 514 and the gate attachment section 516 of the leadframe 504. FIG. 18B shows the subassembly of FIG. 18A with the BDC plate 508 attached to the sections of the leadframe 504. FIG. 18C shows the leadframe 506 prior to being folded and MOSFET 512. The source of the MOSFET 512 attached to the plate 528, and the gate of the MOSFET 512 is attached to the gate attach section 518. FIG. 18D shows the leadframe 306 and the MOSFET 512 of FIG. 18C joined with the subassembly of FIG. 18B with plate the DBC plate 508 bonded to the plate 528 of the leadframe 506. FIG. 18E shows the leadframe 506 partially folded, and FIG. 18F shows the leadframe 206 after it has been fully folded to form the folded leadframe package 500 prior to encapsulation. After encapsulation the completed folded leadframe package 500 is shown in FIG. 18G.

FIG. 19 is an exploded view of the folded leadframe package 500.

FIGS. 20A, 20B, and 20C are respective top, side, and isometric views of a folded leadframe multiple die package 700 according to another embodiment of the present invention. In the drawings an encapsulating material 702 is shown in outline. The folded leadframe package 700 has two leadframes 704 and 706, an integrated circuit (IC) 708, and two MOSFETs 710 and 712 connected together in a manner to form a synchronous voltage regulator with an integral MOSFET driver IC 708. The leadframe 704 has a die bond section 714, a source attach section 718, a gate attach section 720, a gate clip 722. The leadframe 704 also includes seven external leads 724, 726, 728, 730, 732, 734, and 736. The external lead 724 is connected to the die bond section 714, and the external lead 726 is connected to the gate clip 722. The external leads 726-734 are not attached to any other elements in the folded leadframe package 700, but are connected by wire bonds 738 to the IC 708. The external lead 734 is connected to the gate attach section 720, and the external lead 736 is connected to the source attach section 718.

The leadframe 706 is a folded leadframe with the source attach plate 740, a die bond plate 742, and a thinner belt 744 connected between the two plates 740, 742 such that the two plates 740, 742 can be folded into a two parallel plates. The die bond section 714 of the leadframe 704 is die bonded to the MOSFET 710 and the IC 708. The source attach section 718 attached to the source of the MOSFET 712, and the gate attach section 720 is attached to the gate of the MOSFET 712. The source attach plate 740 of the leadframe 706 is attached to the source of the MOSFET 710, and the die bond plate 742 is die bonded to the MOSFET 712. The gate clip 722 is attached to the gate of the MOSFET 710 and the external lead 726. The source of the MOSFET 712 is electrically connected to the IC 708 by a set of wire bonds 746 which may range in number from 2 to 4 in different embodiments of the present invention.

The outside surface of the die bond plate 742 is exposed and thereby enhances the heat dissipation generated by the MOSFET 712.

The die attach plate 740 of leadframe 706 and the die bond section 714 of the leadframe 704 each have an alignment hole 748 which are used to align the two leadframes during the assembly process of the folded leadframe package 700.

Figure 21:
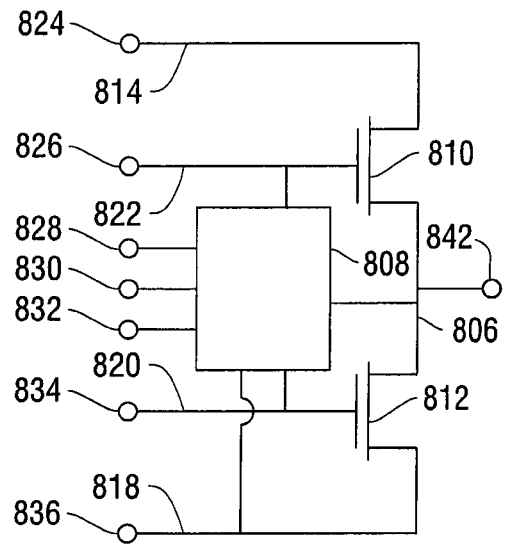
FIG. 21 is a schematic diagram of the interconnections of the die in the folded leadframe stacked die package shown in FIG. 20A.

FIG. 21 is a schematic diagram of the synchronous voltage regulator contained in the folded leadframe package 700 when vertical MOSFETs are used for the MOSFETs 710, 712. The following table shows the correspondence between the leadframe drawings reference numbers and the schematic reference numbers:

| Reference Nos. in the drawings for the Package 700 | Schematic Reference Nos. in FIG. 21 |
|---|---|
| 706 | 806 |
| 708 | 808 |
| 710 | 810 |
| 712 | 812 |
| 714 | 814 |
| 718 | 818 |
| 720 | 820 |
| 722 | 822 |
| 724 | 824 |
| 726 | 826 |
| 728 | 828 |
| 730 | 830 |
| 732 | 832 |
| 734 | 834 |
| 736 | 836 |
| 742 | 842 |

Figure 22A:
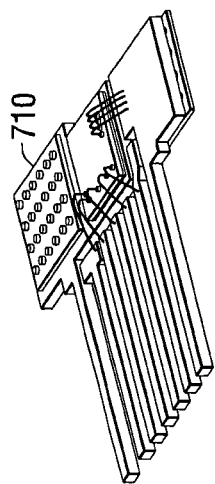
FIGS. 22A, 22B, 22C, 22D, 22E, and 22F are isometric views showing the steps in forming the package shown in FIG. 20A according to an embodiment of the present invention.
Figure 22B:
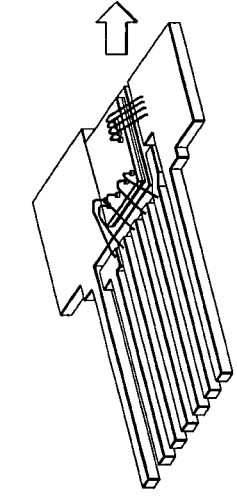
Figure 22C:
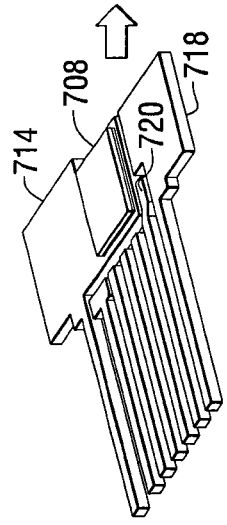
Figure 22D:
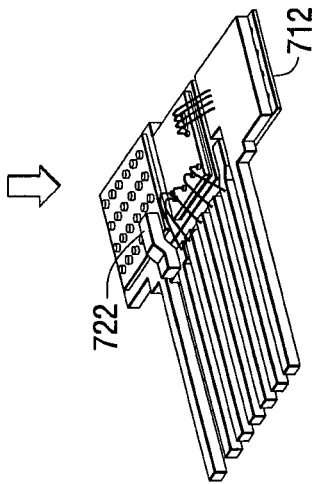
Figure 22E:
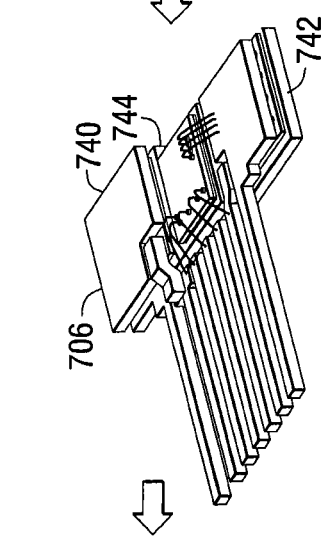
Figure 22F:
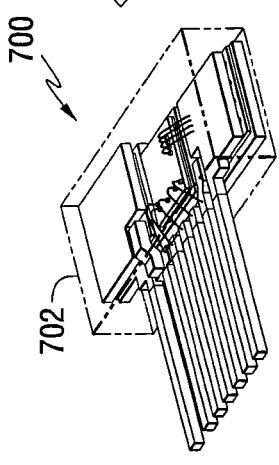

FIGS. 22A-22F and FIGS. 23A-23F show two alternate methods of assembling the folded leadframe package 700. FIG. 22A shows a subassembly with the IC 708 die bonded to the die bond section 714 of the leadframe 704. FIG. 22B shows the subassembly of FIG. 22A with the wire bonds attached to the IC 708 and the leadframe 704. FIG. 22C shows the subassembly of FIG. 22B with the MOSFET 710 die bonded to the die bond section 714, and the MOSFET 712 attached to the source attach section 718 and the gate attach section 720 of the leadframe 704. FIG. 22D shows the subassembly of FIG. 22C with the gate clip 722 attached. FIG. 22E shows the subassembly of FIG. 22D with the folded leadframe 706 attached to the source of the MOSFET 710 and die bonded to the MOSFET 712 to form the folded leadframe package 700 prior to encapsulation. After encapsulation the completed folded leadframe package 700 is shown in FIG. 22F.

In the second alternate method of assembly FIGS. 23A and 23B are the same as FIGS. 22A and 22B. FIG. 23C shows the unfolded leadframe 706 with source of the MOSFET 710 attached to the plate 740, and the MOSFET 712 die bonded to the plate 742. FIG. 23D shows the subassemblies of FIGS. 23B and 23C joined with the MOSFET 710 die bonded to the die bond section 714 of the leadframe 704, and the source attach section 718 and the gate attach section 720 attached to the MOSFET 712. FIG. 23E shows the subassembly of FIG. 23D with the gate clip 722 attached to form the folded leadframe package 700 prior to encapsulation. After encapsulation the completed folded leadframe package 700 is shown in FIG. 23F.

Figure 24:
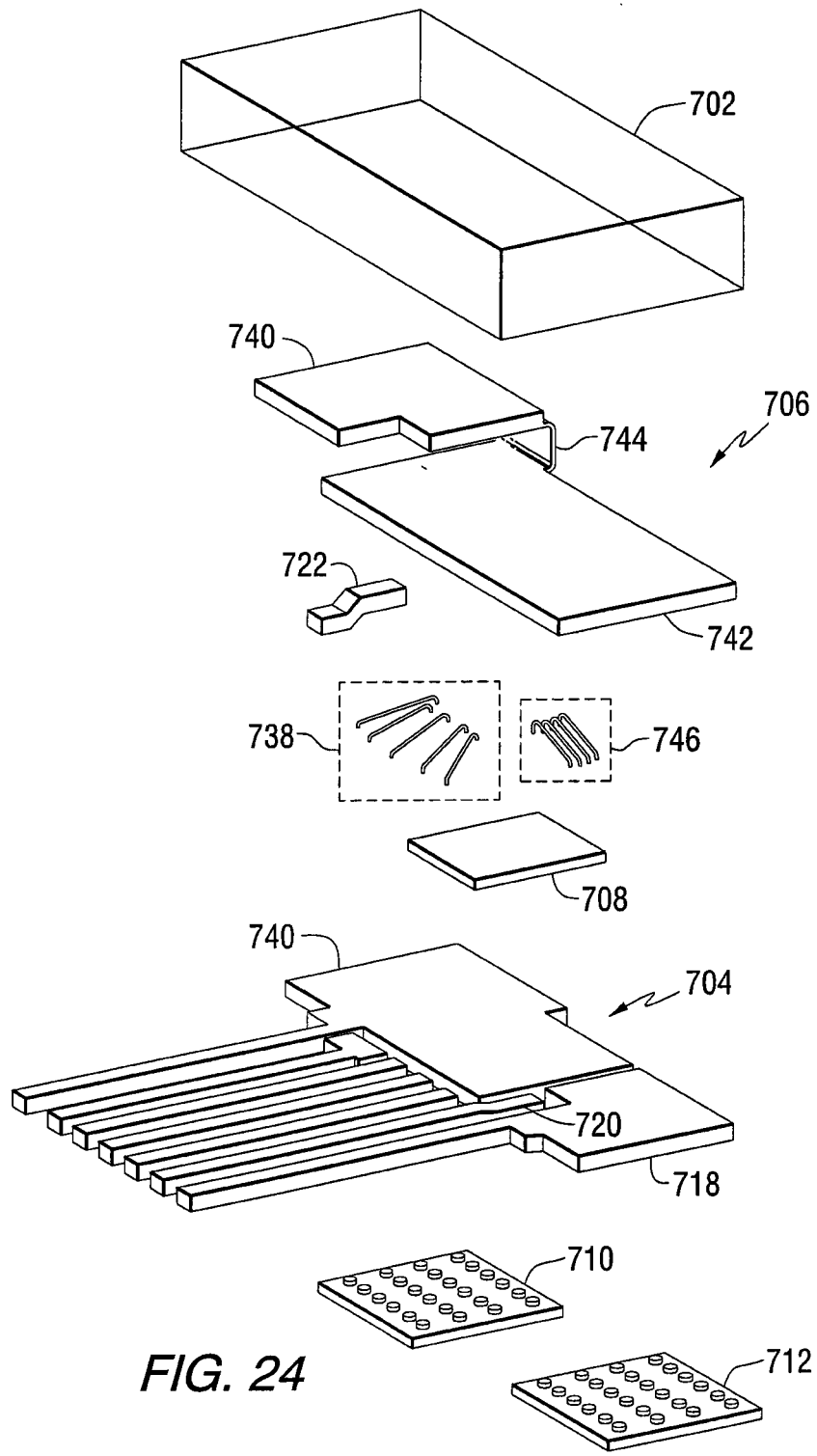
FIG. 24 is an exploded view of the package shown in FIG. 20A.

FIG. 24 is an exploded view of the folded leadframe package 700.

FIGS. 25A, 25B, and 25C are respective top, side, and isometric views of a folded leadframe multiple die package 900 according to another embodiment of the present invention. In the drawings an encapsulating material 902 is shown in outline. The folded leadframe package 900 has two leadframes 904 and 906, an IC 908, and two MOSFETs 910 and 912 connected together in a manner to form a synchronous voltage regulator with an integral MOSFET driver IC 908. The leadframe 904 has a die bond only section 914, a combination source attach and die bond section 916, and a gate attach sections 918 and a gate clip 920. The leadframe 904 also includes seven external leads 922, 924, 926, 928, 930, 932, and 934. The external lead 922 is connected to the die bond only section 914, and the external lead 924 is attached to the gate clip 920. The external leads 926-930 are not attached to any other elements in the folded leadframe package 900, but are connected by wire bonds 936 to the IC 908. The external lead 932 is connected to the combination source attach and die bond section 916, and the external lead 934 is connected to the gate attach sections 918.

The leadframe 906 is a folded leadframe with a source attach plate 938, a die bond plate 940, and a thinner belt 942 connected between the two plates 938, 940 such that the two plates 938, 940 can be folded into a two parallel plates. The die bond only section 914 of the leadframe 904 is die bonded to the MOSFET 910. The combination source attach and die bond section 916 is attached to the source of the MOSFET 912 and die bonded to the IC 908. The gate attach section 918 is attached to the gate of the MOSFET 912. The source attach plate 938 of the leadframe 706 is attached to the source of the MOSFET 910, and the die bond plate 940 is die bonded to the MOSFET 912. The gate clip 920 is attached to the gate of the MOSFET 910 and the external lead 924. The source of the MOSFET 912 is electrically connected to the IC 908 by a set of wire bonds 946 which may range in number from 2 to 4 in different embodiments of the present invention.

The outside surface of the die bond plate 940 is exposed and thereby enhances the heat dissipation generated by the MOSFET 912.

The die attach plate 938 of the leadframe 906 and the die bond only section 914 of the leadframe 904 each have an alignment hole 944 which are used to align the two leadframes during the assembly process of the folded leadframe package 900.

Figure 26:
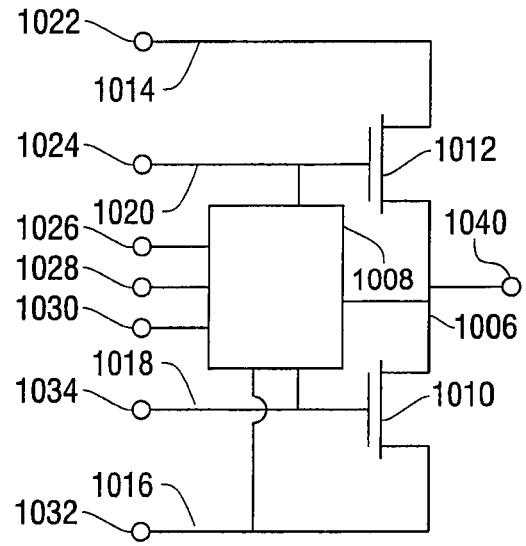
FIG. 26 is a schematic diagram of the interconnections of the die in the folded leadframe stacked die package shown in FIG. 25A.

FIG. 26 is a schematic diagram of the synchronous voltage regulator contained in the folded leadframe package 900 when vertical MOSFETs are used for the MOSFETs 910, 912. The following table shows the correspondence between the leadframe drawings reference numbers and the schematic reference numbers:

| Reference Nos. in the drawings for the Package 900 | Schematic Reference Nos. in FIG. 26 |
|---|---|
| 906 | 1006 |
| 908 | 1008 |
| 910 | 1010 |
| 912 | 1012 |
| 914 | 1014 |
| 918 | 1018 |
| 920 | 1020 |

| Reference Nos. in the drawings for the Package 900 | Schematic Reference Nos. in FIG. 26 |
|---|---|
| 922 | 1022 |
| 924 | 1024 |
| 926 | 1026 |
| 928 | 1028 |
| 930 | 1030 |
| 932 | 1032 |
| 934 | 1034 |
| 940 | 1040 |

FIGS. 27A-27F and FIGS. 28A-28F show two alternate methods of assembling the folded leadframe package 900. FIG. 27A shows a subassembly with the IC 908 die bonded to the combination source attach and die bond section 916 of the leadframe 904. FIG. 27B shows the subassembly of FIG. 27A with the wire bonds attached to the IC 708 and the leadframe 904. FIG. 27C shows the subassembly of FIG. 27B with the MOSFET 910 die bonded to the die bond only section 914, and the MOSFET 912 attached to the source attach section 916 and the gate attach section 918 of the leadframe 904. FIG. 27D shows the subassembly of FIG. 27C with the folded leadframe 906 attached to the source of the MOSFET 710 and die bonded to the MOSFET 912. FIG. 27E shows the subassembly of FIG. 27D with the gate clip 920 attached to form the folded leadframe package 900 prior to encapsulation. After encapsulation the completed folded leadframe package 900 is shown in FIG. 27F.

In the second alternate method of assembly FIGS. 28A and 28B are the same as FIGS. 27A and 27B. FIG. 28C shows the unfolded leadframe 906 with source of the MOSFET 910 attached to the plate 938, and the MOSFET 912 die bonded to the plate 940. FIG. 28D shows the subassemblies of FIGS. 28B and 28C joined with the MOSFET 910 die bonded to the die bond only section 914 of the leadframe 904, and the source attach section 916 and the gate attach section 918 attached to the MOSFET 912. FIG. 28E shows the subassembly of FIG. 28D with the gate clip 920 attached to form the folded leadframe package 900 prior to encapsulation. After encapsulation the completed folded leadframe package 900 is shown in FIG. 28F.

Figure 29:
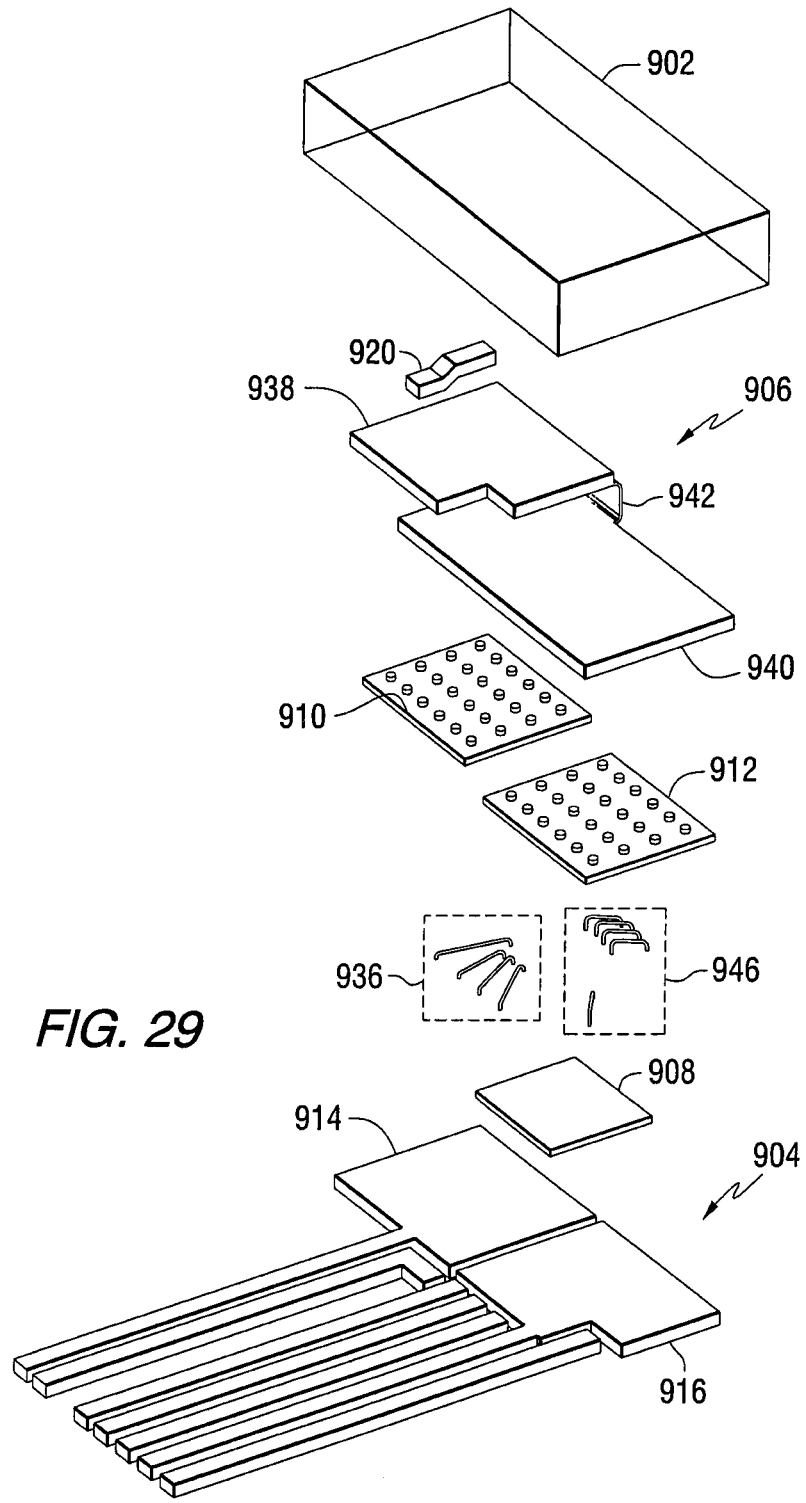
FIG. 29 is an exploded view of the package shown in FIG. 25A.

FIG. 29 is an exploded view of the folded leadframe package 900.

While the invention has been described with reference to particular embodiments, it will be understood by those skilled in the art that various changes may be made and equivalents may be substituted for elements thereof without departing from the scope of the invention. In addition, many modifications may be made to adapt a particular situation or material to the teachings of the invention without departing from the scope of the invention.

Therefore, it is intended that the invention not be limited to the particular embodiments disclosed as the best mode contemplated for carrying out this invention, but that the invention will include all embodiments falling within the scope and spirit of the appended claims.

The invention claimed is:

1. A synchronous voltage converter at least partially encapsulated in encapsulating material, comprising:
   first and second mosfets, each having a source terminal and gate terminal on one side of and a drain terminal on its other side;
   a folded metal lead frame having a die attach metal plate and a source attach metal plate, said attach metal plates vertically spaced from each other and joined together along opposite corresponding edges by a metal belt member,
   a planar metal lead frame having a die attach section and a source attach section, the die and source attach sections are laterally spaced from each other and each attach section has at least one lead extending outside the encapsulating material; wherein
   the first mosfet is attached to the die attach section of the planar metal lead frame and the source of the first mosfet is attached to the source attach plate, and
   the second mosfet is attached to the die attach metal plate and the source of the second mosfet is attached to source attach section of the planar metal lead frame.

2. The synchronous voltage converter of claim 1 wherein the die attach plate and the source attach plate are disposed in parallel planes.

3. The synchronous voltage converter of claim 2 wherein the die attach plate and the source attach plate overlap one another in corresponding regions wherein they are joined by the metal belt member.

4. The synchronous voltage converter of claim 1 wherein a portion of the die attach metal plate is free from encapsulating material to dissipate heat.

5. The synchronous voltage converter of claim 1 wherein the die attach metal plate comprises direct bonded copper.

6. The synchronous voltage converter of claim 1 further comprising an integrated circuit mounted on the die attach section of the planar lead frame and electrically connected to the first and second mosfets.

7. The synchronous voltage converter of claim 6 wherein the integrated circuit controls the operation of the mosfets.

8. The synchronous voltage converter of claim 7 wherein the integrated circuit is electrically isolated from the die attach section of the planar lead frame.

9. The synchronous voltage converter of claim 1 further comprising first and second gate leads connected respectively to the first and second gates of the first and second mosfets, said gate leads extending outside the encapsulating material, a drain lead connected to one of the mosfets and extending outside the encapsulating material, and a source lead connected to the other mosfet and extending outside the encapsulating material.

10. The synchronous voltage converter of claim 9 further comprising first and second gate clips connected between the respective first and second gate leads and the respective first and second gates.

11. The synchronous voltage converter of claim 1 wherein the one mosfet is disposed adjacent one edge of the integrated circuit and the other mosfet is disposed adjacent an opposite edge of the integrated circuit.

12. The synchronous voltage converter of claim 1 wherein the one mosfet is disposed adjacent one edge of the integrated circuit and the other mosfet is disposed and the other mosfet is disposed opposite a surface of the integrated circuit.

13. A synchronous voltage converter at least partially encapsulated in encapsulating material, comprising:
   an integrated circuit and first and second mosfets, each mosfet having a source terminal and gate terminal on one side of each die and a drain terminal on its other side;
   a folded metal lead frame having a die attach metal plate and a source attach metal plate, said attach metal plates vertically spaced from each other and joined together along opposite corresponding edges by a metal belt member,
   a planar metal lead frame having a die attach section and a source attach section, the die and source attach sections are laterally spaced from each other and each attach section has at least one lead extending outside the encapsulating material; wherein the first mosfet is attached to the die attach section of the planar metal lead frame and the source of the first mosfet is attached to the source attach plate of the folded metal lead frame, and the second mosfet is attached to the die attach metal plate of the folded metal lead frame and the source of the second mosfet is attached to source attach section of the planar metal lead frame; and the integrated circuit is attached to the die attach section of the planar lead frame and electrically connected to the first and second mosfets.

14. The synchronous voltage converter of claim 13 wherein the integrated circuit controls the operation of the mosfets.

15. The synchronous voltage converter of claim 14 wherein the integrated circuit is electrically isolated from the die attach section of the planar lead frame.

16. The synchronous voltage converter of claim 13 wherein the one mosfet is disposed adjacent one edge of the integrated circuit and the other mosfet is disposed adjacent an opposite edge of the integrated circuit.

17. The synchronous voltage converter of claim 13 wherein the one mosfet is disposed adjacent one edge of the integrated circuit and the other mosfet is disposed and the other mosfet is disposed opposite a surface of the integrated circuit.

* * * * *